US011949894B2

(12) United States Patent
Xu et al.

(10) Patent No.: US 11,949,894 B2
(45) Date of Patent: Apr. 2, 2024

(54) METHOD AND APPARATUS FOR STRING MATCHING WITH REFERENCE LOCATION CONSTRAINTS

(71) Applicant: TENCENT AMERICA LLC, Palo Alto, CA (US)

(72) Inventors: Xiaozhong Xu, State College, PA (US); Shan Liu, San Jose, CA (US)

(73) Assignee: TENCENT AMERICA LLC, Palo Alto, CA (US)

( * ) Notice: Subject to any disclaimer, the term of this patent is extended or adjusted under 35 U.S.C. 154(b) by 9 days.

(21) Appl. No.: 17/368,616

(22) Filed: Jul. 6, 2021

(65) Prior Publication Data
US 2022/0182650 A1 Jun. 9, 2022

Related U.S. Application Data

(60) Provisional application No. 63/122,342, filed on Dec. 7, 2020.

(51) Int. Cl.
*H04N 19/105* (2014.01)
*H04N 19/132* (2014.01)
*H04N 19/169* (2014.01)
*H04N 19/174* (2014.01)
*H04N 19/44* (2014.01)

(52) U.S. Cl.
CPC .......... *H04N 19/44* (2014.11); *H04N 19/105* (2014.11); *H04N 19/132* (2014.11); *H04N 19/174* (2014.11); *H04N 19/1883* (2014.11)

(58) Field of Classification Search
CPC .... H04N 19/44; H04N 19/105; H04N 19/132; H04N 19/174; H04N 19/1883

USPC .................................................... 375/240.25
See application file for complete search history.

(56) References Cited

U.S. PATENT DOCUMENTS

| 2015/0071357 A1* | 3/2015 | Pang ................. H04N 19/563 375/240.16 |
| 2015/0264348 A1* | 9/2015 | Zou .................. H04N 19/593 375/240.02 |
| 2017/0238001 A1* | 8/2017 | Li .................... H04N 19/11 375/240.12 |

(Continued)

FOREIGN PATENT DOCUMENTS

| EP | 3189661 A1 | 7/2017 |
| WO | 2015102975 A2 | 7/2015 |

OTHER PUBLICATIONS

Wei Pu et al., "Palette Mode Coding in HEVC Screen Content Coding Extension", IEEE Journal on Emerging and Selected Topics in Circuits and Systems, vol. 6, No. 4, Dec. 2016 (13 pages).

(Continued)

*Primary Examiner* — Ayman A Abaza
(74) *Attorney, Agent, or Firm* — ARENTFOX SCHIFF LLP

(57) ABSTRACT

An apparatus for video decoding includes processing circuitry. The processing circuitry determines a string vector for a current string in a current coding tree unit (CTU). The string vector points to a reference string for the current string. The processing circuitry determines that the string vector satisfies a requirement for an allowance of a partial overlapping of the current string and the reference string, and then reconstructs the current string based on the reference string.

17 Claims, 25 Drawing Sheets

(56) References Cited

U.S. PATENT DOCUMENTS

2019/0110079 A1* 4/2019 Lin ................... H04N 19/176
2019/0208217 A1* 7/2019 Zhou .................. H04N 19/139

OTHER PUBLICATIONS

Shan Liu et al., "Overview of HEVC extensions on screen content coding", SIP, vol. 4, e10, received Mar. 30, 2015, revised Aug. 8, 2015 (12 pages).

Benjamin Bross et al., "Versatile Video Coding (Draft 2)", Joint Video Experts Team (JVET) of ITU-T SG 16 WP 3 and ISO/IEC JTC 1/SC 29/WG 11, JVET-K1001-v6, 11th Meeting: Ljubljana, SI, Jul. 10-18, 2018 (140 pages).

Rajan Joshi et al., "Screen content coding test model 1 (SCM 1)", Joint Collaborative Team on Video Coding (JCT-VC) of ITU-T SG 16 WP 3 and ISO/IEC JTC 1/SC 29/WG 11, JCTVC-Q1014, 17th Meeting: Valencia, ES, Mar. 27-Apr. 4, 2014 (5 pages).

Yingbin Wang et al., "Intra Block Copy in AVS3 Video Coding Standard", 2020 IEEE International Conference on Multimedia & Expo Workshops (ICMEW), 2020 (6 pages).

Xiaozhong Xu et al., "Block Vector Prediction in Intra Block Copy for HEVC Screen Content Coding", IEEE, 2015 Data Compression Conference, doi: 10.1109/DCC.2015.22, pp. 273-282 (10 pages).

Xiaozhong Xu et al., "Current Picture Referencing in Versatile Video Coding", 2019 IEEE Conference on Multimedia Information Processing and Retrieval (MIPR) DOI 10.1109/MIPR.2019.00013, pp. 26-31 (6 pages).

Xiaozhong Xu et al., "Intra Block Copy in HEVC Screen Content Coding Extensions", Ieee Journal on Emerging and Selected Topics in Circuits and Systems, 2016 (11 pages).

Xiaozhong Xu et al., "Intra block copy in Versatile Video Coding with Reference Sample Memory Reuse", IEEE, 2019 Picture Coding Symposium (PCS), doi: 10.1109/PCS48520.2019.8954512, 2019 (5 pages).

Xiang Li et al., "Description of SDR video coding technology proposal by Tencent", Joint Video Experts Team (JVET) of ITU-T SG 16 WP 3 and ISO/IEC JTC 1/SC 29/WG 11, JVET-J0029-v1, 10th Meeting: San Diego, US, Apr. 10-20, 2018 (34 pages).

Rajan Joshi et al., "High Efficiency Video Coding (HEVC) Screen Content Coding: Draft 4", Joint Collaborative Team on Video Coding (JCT-VC) of ITU-T SG 16 WP 3 and ISO/IEC JTC 1/SC 29/WG 11, JCTVC-U1005_r1, 21st Meeting: Warsaw, PL, Jun. 19-Jun. 26, 2015 (663 pages).

International Search Report and Written Opinion Issued in Application PCT/US2021/044375 dated Nov. 17, 2021 (12 pages).

Zou Feng et al: "Hash based intra string copy for HEVC based screen content coding", 2015 IEEE International Conference On 1-15 Multimedia & Expo Workshops (ICMEW), IEEE, Jun. 29, 2015, pp. 1-4.

Supplementary European Search Report dated May 4, 2023 in Application No. 21904038.3 (10 pages).

* cited by examiner

METHOD AND APPARATUS FOR STRING MATCHING WITH REFERENCE LOCATION CONSTRAINTS

INCORPORATION BY REFERENCE

This present disclosure claims the benefit of priority to U.S. Provisional Application No. 63/122,342, "STRING MATCHING WITH REFERENCE LOCATION CONSTRAINTS" filed on Dec. 7, 2020, which is incorporated by reference herein in its entirety.

TECHNICAL FIELD

The present disclosure describes embodiments generally related to video coding.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Video coding and decoding can be performed using inter-picture prediction with motion compensation. Uncompressed digital video can include a series of pictures, each picture having a spatial dimension of, for example, 1920×1080 luminance samples and associated chrominance samples. The series of pictures can have a fixed or variable picture rate (informally also known as frame rate), of, for example 60 pictures per second or 60 Hz. Uncompressed video has specific bitrate requirements. For example, 1080p60 4:2:0 video at 8 bit per sample (1920×1080 luminance sample resolution at 60 Hz frame rate) requires close to 1.5 Gbit/s bandwidth. An hour of such video requires more than 600 GBytes of storage space.

One purpose of video coding and decoding can be the reduction of redundancy in the input video signal, through compression. Compression can help reduce the aforementioned bandwidth and/or storage space requirements, in some cases by two orders of magnitude or more. Both lossless compression and lossy compression, as well as a combination thereof can be employed. Lossless compression refers to techniques where an exact copy of the original signal can be reconstructed from the compressed original signal. When using lossy compression, the reconstructed signal may not be identical to the original signal, but the distortion between original and reconstructed signals is small enough to make the reconstructed signal useful for the intended application. In the case of video, lossy compression is widely employed. The amount of distortion tolerated depends on the application; for example, users of certain consumer streaming applications may tolerate higher distortion than users of television distribution applications. The compression ratio achievable can reflect that: higher allowable/tolerable distortion can yield higher compression ratios.

A video encoder and decoder can utilize techniques from several broad categories, including, for example, motion compensation, transform, quantization, and entropy coding.

Video codec technologies can include techniques known as intra coding. In intra coding, sample values are represented without reference to samples or other data from previously reconstructed reference pictures. In some video codecs, the picture is spatially subdivided into blocks of samples. When all blocks of samples are coded in intra mode, that picture can be an intra picture. Intra pictures and their derivations such as independent decoder refresh pictures, can be used to reset the decoder state and can, therefore, be used as the first picture in a coded video bitstream and a video session, or as a still image. The samples of an intra block can be exposed to a transform, and the transform coefficients can be quantized before entropy coding. Intra prediction can be a technique that minimizes sample values in the pre-transform domain. In some cases, the smaller the DC value after a transform is, and the smaller the AC coefficients are, the fewer the bits that are required at a given quantization step size to represent the block after entropy coding.

Traditional intra coding such as known from, for example MPEG-2 generation coding technologies, does not use intra prediction. However, some newer video compression technologies include techniques that attempt, from, for example, surrounding sample data and/or metadata obtained during the encoding and/or decoding of spatially neighboring, and preceding in decoding order, blocks of data. Such techniques are henceforth called "intra prediction" techniques. Note that in at least some cases, intra prediction is using reference data only from the current picture under reconstruction and not from reference pictures.

There can be many different forms of intra prediction. When more than one of such techniques can be used in a given video coding technology, the technique in use can be coded in an intra prediction mode. In certain cases, modes can have submodes and/or parameters, and those can be coded individually or included in the mode codeword. Which codeword to use for a given mode, submode, and/or parameter combination can have an impact in the coding efficiency gain through intra prediction, and so can the entropy coding technology used to translate the codewords into a bitstream.

A certain mode of intra prediction was introduced with H.264, refined in H.265, and further refined in newer coding technologies such as joint exploration model (JEM), versatile video coding (VVC), and benchmark set (BMS). A predictor block can be formed using neighboring sample values belonging to already available samples. Sample values of neighboring samples are copied into the predictor block according to a direction. A reference to the direction in use can be coded in the bitstream or may itself be predicted.

Referring to FIG. 1A, depicted in the lower right is a subset of nine predictor directions known from H.265's 33 possible predictor directions (corresponding to the 33 angular modes of the 35 intra modes). The point where the arrows converge (101) represents the sample being predicted. The arrows represent the direction from which the sample is being predicted. For example, arrow (102) indicates that sample (101) is predicted from a sample or samples to the upper right, at a 45 degree angle from the horizontal. Similarly, arrow (103) indicates that sample (101) is predicted from a sample or samples to the lower left of sample (101), in a 22.5 degree angle from the horizontal.

Still referring to FIG. 1A, on the top left there is depicted a square block (104) of 4×4 samples (indicated by a dashed, boldface line). The square block (104) includes 16 samples, each labelled with an "S", its position in the Y dimension (e.g., row index) and its position in the X dimension (e.g., column index). For example, sample S21 is the second sample in the Y dimension (from the top) and the first (from the left) sample in the X dimension. Similarly, sample S44 is the fourth sample in block (104) in both the Y and X dimensions. As the block is 4×4 samples in size, S44 is at the bottom right. Further shown are reference samples that follow a similar numbering scheme. A reference sample is labelled with an R, its Y position (e.g., row index) and X position (column index) relative to block (104). In both H.264 and H.265, prediction samples neighbor the block under reconstruction; therefore no negative values need to be used.

Intra picture prediction can work by copying reference sample values from the neighboring samples as appropriated by the signaled prediction direction. For example, assume the coded video bitstream includes signaling that, for this block, indicates a prediction direction consistent with arrow (102)—that is, samples are predicted from a prediction sample or samples to the upper right, at a 45 degree angle from the horizontal. In that case, samples S41, S32, S23, and S14 are predicted from the same reference sample R05. Sample S44 is then predicted from reference sample R08.

In certain cases, the values of multiple reference samples may be combined, for example through interpolation, in order to calculate a reference sample; especially when the directions are not evenly divisible by 45 degrees.

The number of possible directions has increased as video coding technology has developed. In H.264 (year 2003), nine different direction could be represented. That increased to 33 in H.265 (year 2013), and JEM/VVC/BMS, at the time of disclosure, can support up to 65 directions. Experiments have been conducted to identify the most likely directions, and certain techniques in the entropy coding are used to represent those likely directions in a small number of bits, accepting a certain penalty for less likely directions. Further, the directions themselves can sometimes be predicted from neighboring directions used in neighboring, already decoded, blocks.

FIG. 1B shows a schematic (180) that depicts 65 intra prediction directions according to JEM to illustrate the increasing number of prediction directions over time.

The mapping of intra prediction directions bits in the coded video bitstream that represent the direction can be different from video coding technology to video coding technology; and can range, for example, from simple direct mappings of prediction direction to intra prediction mode, to codewords, to complex adaptive schemes involving most probable modes, and similar techniques. In all cases, however, there can be certain directions that are statistically less likely to occur in video content than certain other directions. As the goal of video compression is the reduction of redundancy, those less likely directions will, in a well working video coding technology, be represented by a larger number of bits than more likely directions.

Motion compensation can be a lossy compression technique and can relate to techniques where a block of sample data from a previously reconstructed picture or part thereof (reference picture), after being spatially shifted in a direction indicated by a motion vector (MV henceforth), is used for the prediction of a newly reconstructed picture or picture part. In some cases, the reference picture can be the same as the picture currently under reconstruction. MVs can have two dimensions X and Y, or three dimensions, the third being an indication of the reference picture in use (the latter, indirectly, can be a time dimension).

In some video compression techniques, an MV applicable to a certain area of sample data can be predicted from other MVs, for example from those related to another area of sample data spatially adjacent to the area under reconstruction, and preceding that MV in decoding order. Doing so can substantially reduce the amount of data required for coding the MV, thereby removing redundancy and increasing compression. MV prediction can work effectively, for example, because when coding an input video signal derived from a camera (known as natural video) there is a statistical likelihood that areas larger than the area to which a single MV is applicable move in a similar direction and, therefore, can in some cases be predicted using a similar motion vector derived from MVs of neighboring area. That results in the MV found for a given area to be similar or the same as the MV predicted from the surrounding MVs, and that in turn can be represented, after entropy coding, in a smaller number of bits than what would be used if coding the MV directly. In some cases, MV prediction can be an example of lossless compression of a signal (namely: the MVs) derived from the original signal (namely: the sample stream). In other cases, MV prediction itself can be lossy, for example because of rounding errors when calculating a predictor from several surrounding MVs.

Various MV prediction mechanisms are described in H.265/HEVC (ITU-T Rec. H.265, "High Efficiency Video Coding", December 2016). Out of the many MV prediction mechanisms that H.265 offers, described here is a technique henceforth referred to as "spatial merge".

Referring to FIG. 2, a current block (201) comprises samples that have been found by the encoder during the motion search process to be predictable from a previous block of the same size that has been spatially shifted. Instead of coding that MV directly, the MV can be derived from metadata associated with one or more reference pictures, for example from the most recent (in decoding order) reference picture, using the MV associated with either one of five surrounding samples, denoted A0, A1, and B0, B1, B2 (202 through 206, respectively). In H.265, the MV prediction can use predictors from the same reference picture that the neighboring block is using.

SUMMARY

Aspects of the disclosure provide methods and apparatuses for video encoding/decoding. In some examples, an apparatus for video decoding includes processing circuitry. The processing circuitry determines a string vector for a current string in a current coding tree unit (CTU). The string vector points to a reference string for the current string. The processing circuitry determines that the string vector satisfies a requirement for an allowance of a partial overlapping of the current string and the reference string, and then reconstructs the current string based on the reference string.

In some embodiments, the processing circuitry can reconstruct the current string by portions. For example, the processing circuitry reconstructs a first portion of the current string before a reconstruction of a second portion of the current string, and reconstructs the second portion of the current string based on the first portion of the current string.

In some examples, the processing circuitry can determine that the string vector satisfies the requirement for the allowance of the partial overlapping of the current string and the reference string in response to at least one of a vertical component and a horizontal component of the string vector being negative.

In an example, the processing circuitry skips overlapping constraints in response to a satisfaction of the requirement for the allowance of the partial overlapping of the current string and the reference string and can apply the overlapping constraints on the string vector in response to a failure to satisfy the requirement for the allowance of the partial overlapping of the current string and the reference string.

In an example, a horizontal scan order for strings is used. The processing circuitry determines that a vertical component of the string vector is negative. Then, the processing circuitry reconstructs the current string in a row by row manner. For example, the processing circuitry reconstructs a first sample row of the current string and reconstructs a second sample row of the current string based on the first sample row of the current string.

In another example, a vertical scan order for strings is used. The processing circuitry determines that a horizontal component of the string vector is negative. Then, the processing circuitry reconstructs the current string in a column by column manner. For example, the processing circuitry reconstructs a first sample column of the current string, and reconstructs a second sample column of the current string based on the first sample column of the current string.

In some embodiments, the reference string may overlap with a sample row above the current CTU. Then, the processing circuitry can access, in response to the reference string overlaps with a sample row above the current CTU, a buffer storing samples in the sample row for a reconstruction of the current string.

Aspects of the disclosure also provide a non-transitory computer-readable medium storing instructions which when executed by a computer for video encoding/decoding cause the computer to perform any of the methods for video encoding/decoding.

BRIEF DESCRIPTION OF THE DRAWINGS

Further features, the nature, and various advantages of the disclosed subject matter will be more apparent from the following detailed description and the accompanying drawings in which:

FIGS. 12A-12D show examples of intra block copy according to an embodiment of the disclosure.

DETAILED DESCRIPTION OF EMBODIMENTS

Figure 3:
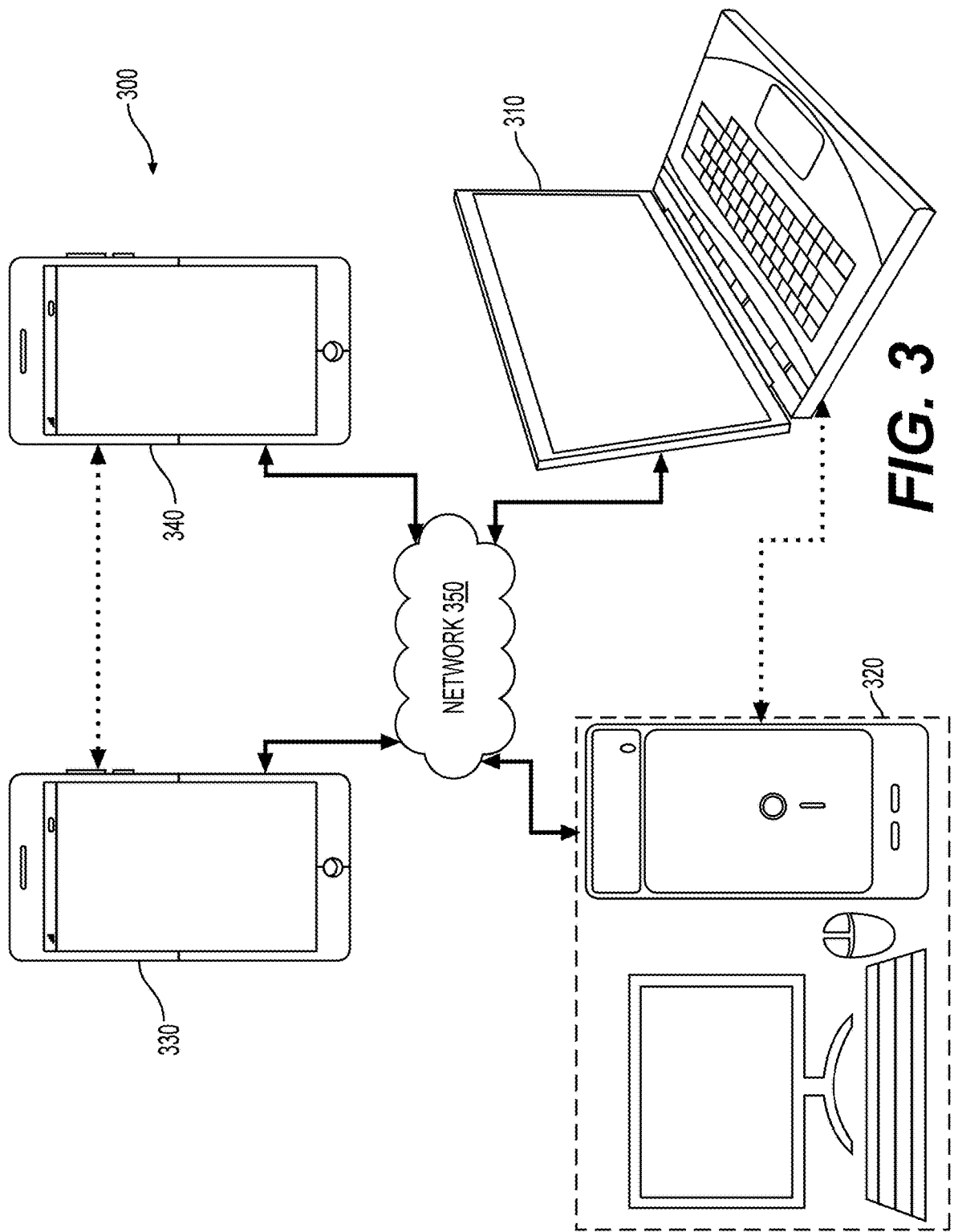
FIG. 3 is a schematic illustration of a simplified block diagram of a communication system (300) in accordance with an embodiment.

FIG. 3 illustrates a simplified block diagram of a communication system (300) according to an embodiment of the present disclosure. The communication system (300) includes a plurality of terminal devices that can communicate with each other, via, for example, a network (350). For example, the communication system (300) includes a first pair of terminal devices (310) and (320) interconnected via the network (350). In the FIG. 3 example, the first pair of terminal devices (310) and (320) performs unidirectional transmission of data. For example, the terminal device (310) may code video data (e.g., a stream of video pictures that are captured by the terminal device (310)) for transmission to the other terminal device (320) via the network (350). The encoded video data can be transmitted in the form of one or more coded video bitstreams. The terminal device (320) may receive the coded video data from the network (350), decode the coded video data to recover the video pictures and display video pictures according to the recovered video data. Unidirectional data transmission may be common in media serving applications and the like.

In another example, the communication system (300) includes a second pair of terminal devices (330) and (340) that performs bidirectional transmission of coded video data that may occur, for example, during videoconferencing. For bidirectional transmission of data, in an example, each terminal device of the terminal devices (330) and (340) may code video data (e.g., a stream of video pictures that are captured by the terminal device) for transmission to the other terminal device of the terminal devices (330) and (340) via the network (350). Each terminal device of the terminal devices (330) and (340) also may receive the coded video data transmitted by the other terminal device of the terminal devices (330) and (340), and may decode the coded video data to recover the video pictures and may display video pictures at an accessible display device according to the recovered video data.

In the FIG. 3 example, the terminal devices (310), (320), (330) and (340) may be illustrated as servers, personal computers and smart phones but the principles of the present disclosure may be not so limited. Embodiments of the present disclosure find application with laptop computers, tablet computers, media players and/or dedicated video conferencing equipment. The network (350) represents any number of networks that convey coded video data among the terminal devices (310), (320), (330) and (340), including for example wireline (wired) and/or wireless communication networks. The communication network (350) may exchange data in circuit-switched and/or packet-switched channels.

Representative networks include telecommunications networks, local area networks, wide area networks and/or the Internet. For the purposes of the present discussion, the architecture and topology of the network (350) may be immaterial to the operation of the present disclosure unless explained herein below.

Figure 4:
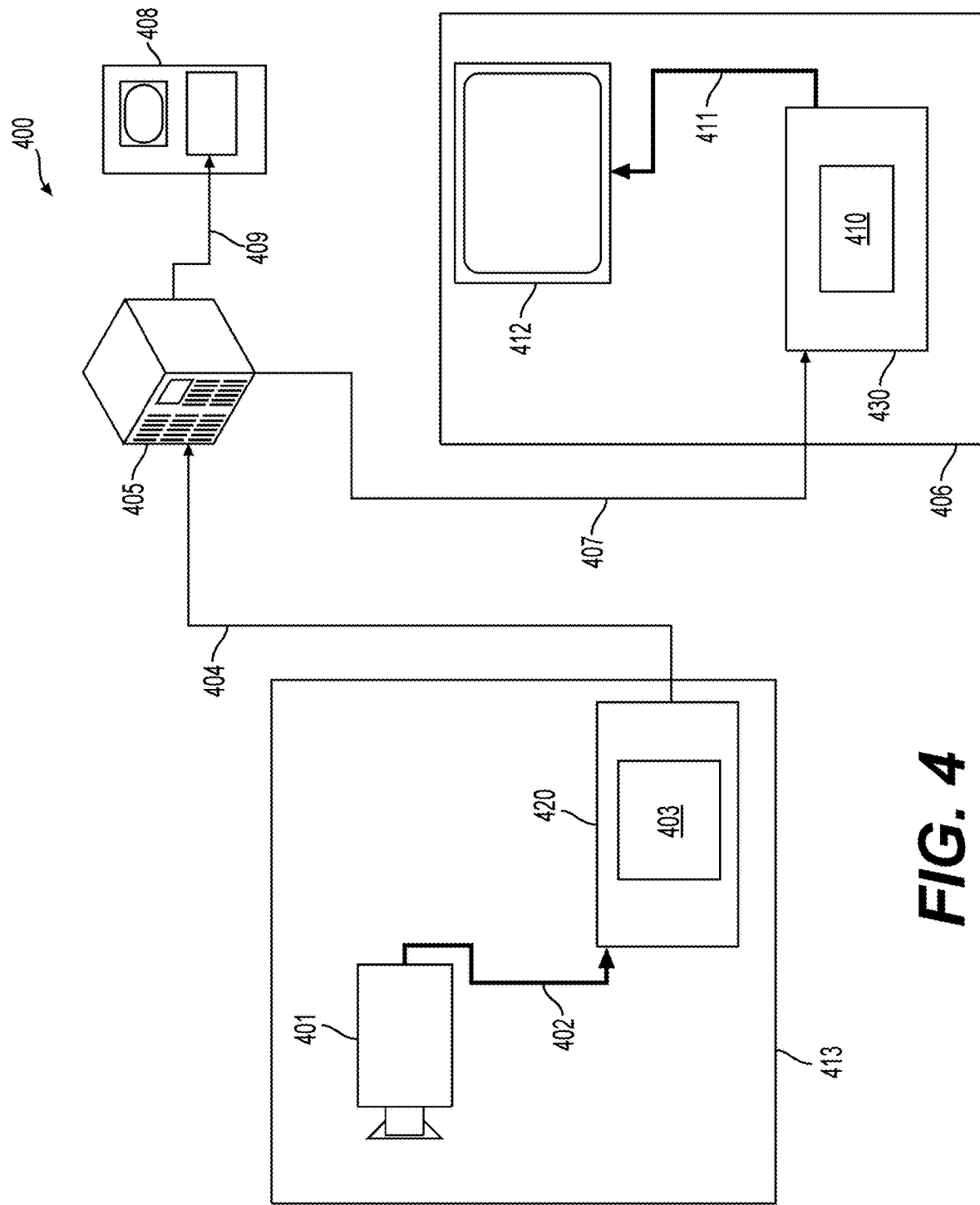
FIG. 4 is a schematic illustration of a simplified block diagram of a communication system (400) in accordance with an embodiment.

FIG. 4 illustrates, as an example for an application for the disclosed subject matter, the placement of a video encoder and a video decoder in a streaming environment. The disclosed subject matter can be equally applicable to other video enabled applications, including, for example, video conferencing, digital TV, storing of compressed video on digital media including CD, DVD, memory stick and the like, and so on.

A streaming system may include a capture subsystem (413), that can include a video source (401), for example a digital camera, creating for example a stream of video pictures (402) that are uncompressed. In an example, the stream of video pictures (402) includes samples that are taken by the digital camera. The stream of video pictures (402), depicted as a bold line to emphasize a high data volume when compared to encoded video data (404) (or coded video bitstreams), can be processed by an electronic device (420) that includes a video encoder (403) coupled to the video source (401). The video encoder (403) can include hardware, software, or a combination thereof to enable or implement aspects of the disclosed subject matter as described in more detail below. The encoded video data (404) (or encoded video bitstream (404)), depicted as a thin line to emphasize the lower data volume when compared to the stream of video pictures (402), can be stored on a streaming server (405) for future use. One or more streaming client subsystems, such as client subsystems (406) and (408) in FIG. 4 can access the streaming server (405) to retrieve copies (407) and (409) of the encoded video data (404). A client subsystem (406) can include a video decoder (410), for example, in an electronic device (430). The video decoder (410) decodes the incoming copy (407) of the encoded video data and creates an outgoing stream of video pictures (411) that can be rendered on a display (412) (e.g., display screen) or other rendering device (not depicted). In some streaming systems, the encoded video data (404), (407), and (409) (e.g., video bitstreams) can be encoded according to certain video coding/compression standards. Examples of those standards include ITU-T Recommendation H.265. In an example, a video coding standard under development is informally known as Versatile Video Coding (VVC). The disclosed subject matter may be used in the context of VVC.

It is noted that the electronic devices (420) and (430) can include other components (not shown). For example, the electronic device (420) can include a video decoder (not shown) and the electronic device (430) can include a video encoder (not shown) as well.

Figure 5:
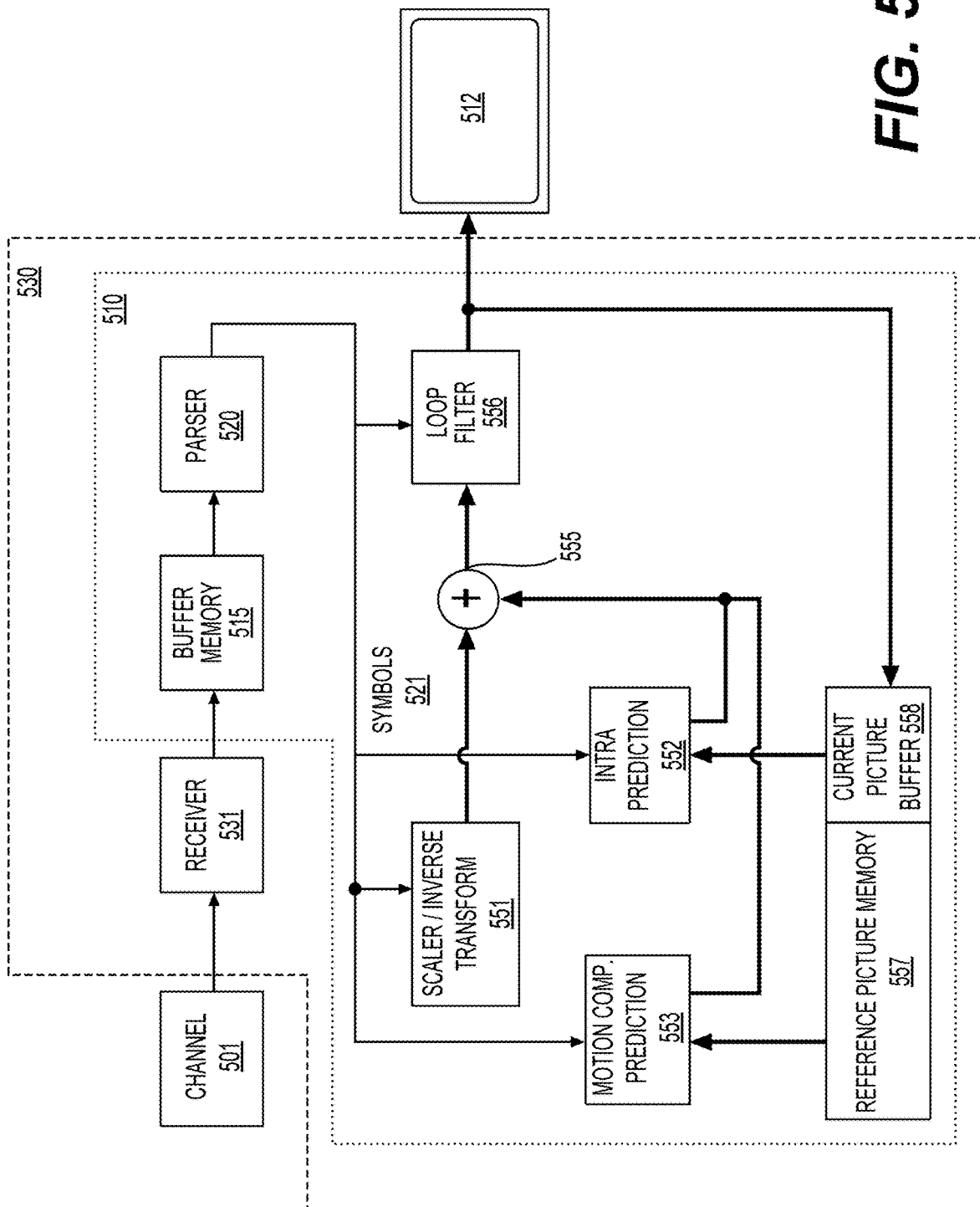
FIG. 5 is a schematic illustration of a simplified block diagram of a decoder in accordance with an embodiment.

FIG. 5 shows a block diagram of a video decoder (510) according to an embodiment of the present disclosure. The video decoder (510) can be included in an electronic device (530). The electronic device (530) can include a receiver (531) (e.g., receiving circuitry). The video decoder (510) can be used in the place of the video decoder (410) in the FIG. 4 example.

The receiver (531) may receive one or more coded video sequences to be decoded by the video decoder (510); in the same or another embodiment, one coded video sequence at a time, where the decoding of each coded video sequence is independent from other coded video sequences. The coded video sequence may be received from a channel (501), which may be a hardware/software link to a storage device which stores the encoded video data. The receiver (531) may receive the encoded video data with other data, for example, coded audio data and/or ancillary data streams, that may be forwarded to their respective using entities (not depicted). The receiver (531) may separate the coded video sequence from the other data. To combat network jitter, a buffer memory (515) may be coupled in between the receiver (531) and an entropy decoder/parser (520) ("parser (520)" henceforth). In certain applications, the buffer memory (515) is part of the video decoder (510). In others, it can be outside of the video decoder (510) (not depicted). In still others, there can be a buffer memory (not depicted) outside of the video decoder (510), for example to combat network jitter, and in addition another buffer memory (515) inside the video decoder (510), for example to handle playout timing. When the receiver (531) is receiving data from a store/forward device of sufficient bandwidth and controllability, or from an isosynchronous network, the buffer memory (515) may not be needed, or can be small. For use on best effort packet networks such as the Internet, the buffer memory (515) may be required, can be comparatively large and can be advantageously of adaptive size, and may at least partially be implemented in an operating system or similar elements (not depicted) outside of the video decoder (510).

The video decoder (510) may include the parser (520) to reconstruct symbols (521) from the coded video sequence. Categories of those symbols include information used to manage operation of the video decoder (510), and potentially information to control a rendering device such as a render device (512) (e.g., a display screen) that is not an integral part of the electronic device (530) but can be coupled to the electronic device (530), as was shown in FIG. 5. The control information for the rendering device(s) may be in the form of Supplemental Enhancement Information (SEI messages) or Video Usability Information (VUI) parameter set fragments (not depicted). The parser (520) may parse/entropy-decode the coded video sequence that is received. The coding of the coded video sequence can be in accordance with a video coding technology or standard, and can follow various principles, including variable length coding, Huffman coding, arithmetic coding with or without context sensitivity, and so forth. The parser (520) may extract from the coded video sequence, a set of subgroup parameters for at least one of the subgroups of pixels in the video decoder, based upon at least one parameter corresponding to the group. Subgroups can include Groups of Pictures (GOPs), pictures, tiles, slices, macroblocks, Coding Units (CUs), blocks, Transform Units (TUs), Prediction Units (PUs) and so forth. The parser (520) may also extract from the coded video sequence information such as transform coefficients, quantizer parameter values, motion vectors, and so forth.

The parser (520) may perform an entropy decoding/parsing operation on the video sequence received from the buffer memory (515), so as to create symbols (521).

Reconstruction of the symbols (521) can involve multiple different units depending on the type of the coded video picture or parts thereof (such as: inter and intra picture, inter and intra block), and other factors. Which units are involved, and how, can be controlled by the subgroup control information that was parsed from the coded video sequence by the parser (520). The flow of such subgroup control information between the parser (520) and the multiple units below is not depicted for clarity.

Beyond the functional blocks already mentioned, the video decoder (510) can be conceptually subdivided into a number of functional units as described below. In a practical implementation operating under commercial constraints, many of these units interact closely with each other and can, at least partly, be integrated into each other. However, for the purpose of describing the disclosed subject matter, the conceptual subdivision into the functional units below is appropriate.

A first unit is the scaler/inverse transform unit (551). The scaler/inverse transform unit (551) receives a quantized transform coefficient as well as control information, including which transform to use, block size, quantization factor, quantization scaling matrices, etc. as symbol(s) (521) from the parser (520). The scaler/inverse transform unit (551) can output blocks comprising sample values, that can be input into aggregator (555).

In some cases, the output samples of the scaler/inverse transform (551) can pertain to an intra coded block; that is: a block that is not using predictive information from previously reconstructed pictures, but can use predictive information from previously reconstructed parts of the current picture. Such predictive information can be provided by an intra picture prediction unit (552). In some cases, the intra picture prediction unit (552) generates a block of the same size and shape of the block under reconstruction, using surrounding already reconstructed information fetched from the current picture buffer (558). The current picture buffer (558) buffers, for example, partly reconstructed current picture and/or fully reconstructed current picture. The aggregator (555), in some cases, adds, on a per sample basis, the prediction information the intra prediction unit (552) has generated to the output sample information as provided by the scaler/inverse transform unit (551).

In other cases, the output samples of the scaler/inverse transform unit (551) can pertain to an inter coded, and potentially motion compensated block. In such a case, a motion compensation prediction unit (553) can access reference picture memory (557) to fetch samples used for prediction. After motion compensating the fetched samples in accordance with the symbols (521) pertaining to the block, these samples can be added by the aggregator (555) to the output of the scaler/inverse transform unit (551) (in this case called the residual samples or residual signal) so as to generate output sample information. The addresses within the reference picture memory (557) from where the motion compensation prediction unit (553) fetches prediction samples can be controlled by motion vectors, available to the motion compensation prediction unit (553) in the form of symbols (521) that can have, for example X, Y, and reference picture components. Motion compensation also can include interpolation of sample values as fetched from the reference picture memory (557) when sub-sample exact motion vectors are in use, motion vector prediction mechanisms, and so forth.

The output samples of the aggregator (555) can be subject to various loop filtering techniques in the loop filter unit (556). Video compression technologies can include in-loop filter technologies that are controlled by parameters included in the coded video sequence (also referred to as coded video bitstream) and made available to the loop filter unit (556) as symbols (521) from the parser (520), but can also be responsive to meta-information obtained during the decoding of previous (in decoding order) parts of the coded picture or coded video sequence, as well as responsive to previously reconstructed and loop-filtered sample values.

The output of the loop filter unit (556) can be a sample stream that can be output to the render device (512) as well as stored in the reference picture memory (557) for use in future inter-picture prediction.

Certain coded pictures, once fully reconstructed, can be used as reference pictures for future prediction. For example, once a coded picture corresponding to a current picture is fully reconstructed and the coded picture has been identified as a reference picture (by, for example, the parser (520)), the current picture buffer (558) can become a part of the reference picture memory (557), and a fresh current picture buffer can be reallocated before commencing the reconstruction of the following coded picture.

The video decoder (510) may perform decoding operations according to a predetermined video compression technology in a standard, such as ITU-T Rec. H.265. The coded video sequence may conform to a syntax specified by the video compression technology or standard being used, in the sense that the coded video sequence adheres to both the syntax of the video compression technology or standard and the profiles as documented in the video compression technology or standard. Specifically, a profile can select certain tools as the only tools available for use under that profile from all the tools available in the video compression technology or standard. Also necessary for compliance can be that the complexity of the coded video sequence is within bounds as defined by the level of the video compression technology or standard. In some cases, levels restrict the maximum picture size, maximum frame rate, maximum reconstruction sample rate (measured in, for example megasamples per second), maximum reference picture size, and so on. Limits set by levels can, in some cases, be further restricted through Hypothetical Reference Decoder (HRD) specifications and metadata for HRD buffer management signaled in the coded video sequence.

In an embodiment, the receiver (531) may receive additional (redundant) data with the encoded video. The additional data may be included as part of the coded video sequence(s). The additional data may be used by the video decoder (510) to properly decode the data and/or to more accurately reconstruct the original video data. Additional data can be in the form of, for example, temporal, spatial, or signal noise ratio (SNR) enhancement layers, redundant slices, redundant pictures, forward error correction codes, and so on.

Figure 6:
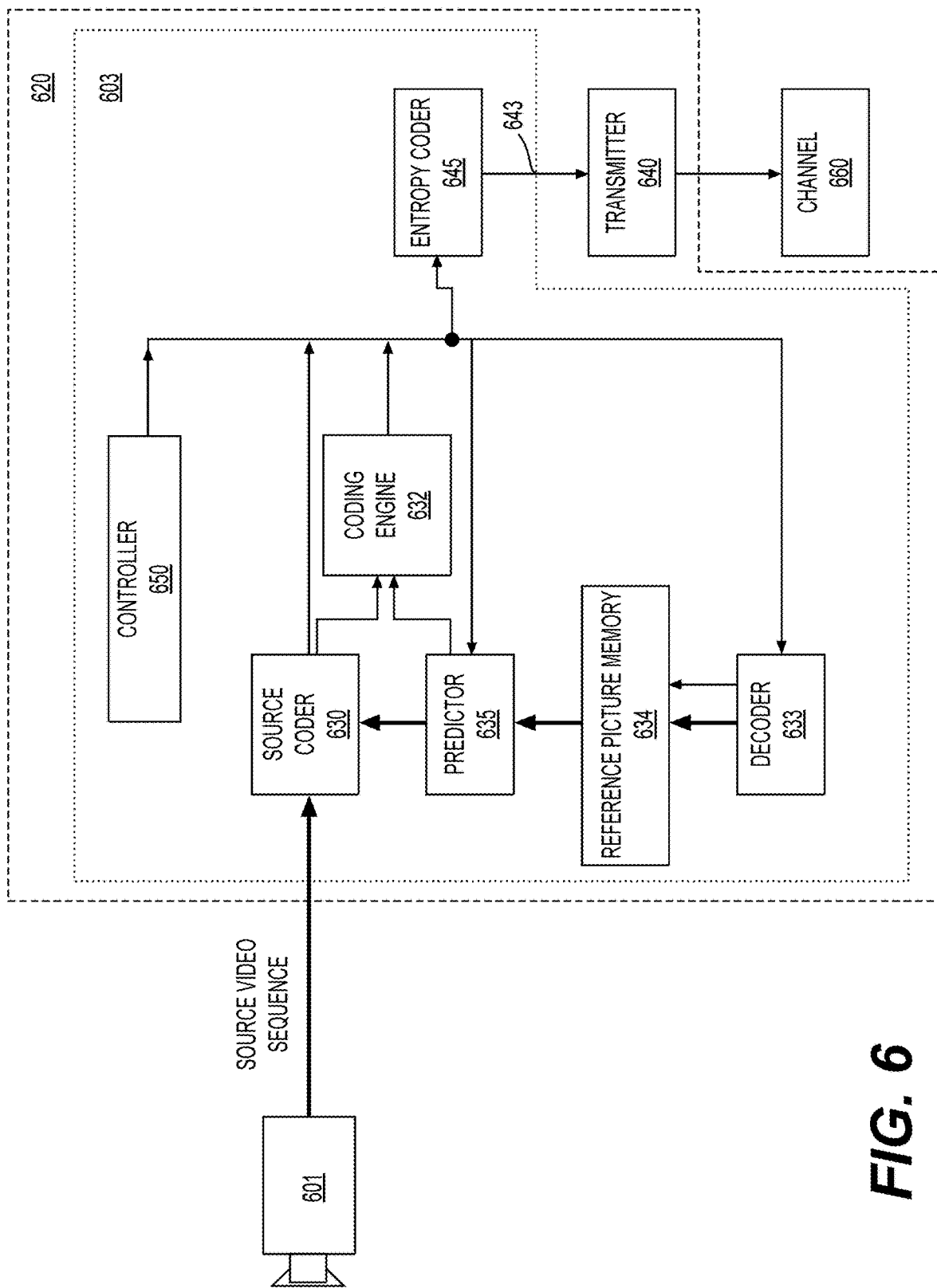
FIG. 6 is a schematic illustration of a simplified block diagram of an encoder in accordance with an embodiment.

FIG. 6 shows a block diagram of a video encoder (603) according to an embodiment of the present disclosure. The video encoder (603) is included in an electronic device (620). The electronic device (620) includes a transmitter (640) (e.g., transmitting circuitry). The video encoder (603) can be used in the place of the video encoder (403) in the FIG. 4 example.

The video encoder (603) may receive video samples from a video source (601) (that is not part of the electronic device (620) in the FIG. 6 example) that may capture video image(s) to be coded by the video encoder (603). In another example, the video source (601) is a part of the electronic device (620).

The video source (601) may provide the source video sequence to be coded by the video encoder (603) in the form of a digital video sample stream that can be of any suitable bit depth (for example: 8 bit, 10 bit, 12 bit, . . . ), any color space (for example, BT.601 Y CrCB, RGB, . . . ), and any suitable sampling structure (for example Y CrCb 4:2:0, Y CrCb 4:4:4). In a media serving system, the video source (601) may be a storage device storing previously prepared video. In a videoconferencing system, the video source (601) may be a camera that captures local image information as a video sequence. Video data may be provided as a plurality of individual pictures that impart motion when viewed in sequence. The pictures themselves may be organized as a spatial array of pixels, wherein each pixel can comprise one or more samples depending on the sampling structure, color space, etc. in use. A person skilled in the art can readily understand the relationship between pixels and samples. The description below focuses on samples.

According to an embodiment, the video encoder (603) may code and compress the pictures of the source video sequence into a coded video sequence (643) in real time or under any other time constraints as required by the application. Enforcing appropriate coding speed is one function of a controller (650). In some embodiments, the controller (650) controls other functional units as described below and is functionally coupled to the other functional units. The coupling is not depicted for clarity. Parameters set by the controller (650) can include rate control related parameters (picture skip, quantizer, lambda value of rate-distortion optimization techniques, . . . ), picture size, group of pictures (GOP) layout, maximum motion vector search range, and so forth. The controller (650) can be configured to have other suitable functions that pertain to the video encoder (603) optimized for a certain system design.

In some embodiments, the video encoder (603) is configured to operate in a coding loop. As an oversimplified description, in an example, the coding loop can include a source coder (630) (e.g., responsible for creating symbols, such as a symbol stream, based on an input picture to be coded, and a reference picture(s)), and a (local) decoder (633) embedded in the video encoder (603). The decoder (633) reconstructs the symbols to create the sample data in a similar manner as a (remote) decoder also would create (as any compression between symbols and coded video bitstream is lossless in the video compression technologies considered in the disclosed subject matter). The reconstructed sample stream (sample data) is input to the reference picture memory (634). As the decoding of a symbol stream leads to bit-exact results independent of decoder location (local or remote), the content in the reference picture memory (634) is also bit exact between the local encoder and remote encoder. In other words, the prediction part of an encoder "sees" as reference picture samples exactly the same sample values as a decoder would "see" when using prediction during decoding. This fundamental principle of reference picture synchronicity (and resulting drift, if synchronicity cannot be maintained, for example because of channel errors) is used in some related arts as well.

The operation of the "local" decoder (633) can be the same as of a "remote" decoder, such as the video decoder (510), which has already been described in detail above in conjunction with FIG. 5. Briefly referring also to FIG. 5, however, as symbols are available and encoding/decoding of symbols to a coded video sequence by an entropy coder (645) and the parser (520) can be lossless, the entropy decoding parts of the video decoder (510), including the buffer memory (515), and parser (520) may not be fully implemented in the local decoder (633).

An observation that can be made at this point is that any decoder technology except the parsing/entropy decoding that is present in a decoder also necessarily needs to be present, in substantially identical functional form, in a corresponding encoder. For this reason, the disclosed subject matter focuses on decoder operation. The description of encoder technologies can be abbreviated as they are the inverse of the comprehensively described decoder technologies. Only in certain areas a more detail description is required and provided below.

During operation, in some examples, the source coder (630) may perform motion compensated predictive coding, which codes an input picture predictively with reference to one or more previously coded picture from the video sequence that were designated as "reference pictures." In this manner, the coding engine (632) codes differences between pixel blocks of an input picture and pixel blocks of reference picture(s) that may be selected as prediction reference(s) to the input picture.

The local video decoder (633) may decode coded video data of pictures that may be designated as reference pictures, based on symbols created by the source coder (630). Operations of the coding engine (632) may advantageously be lossy processes. When the coded video data may be decoded at a video decoder (not shown in FIG. 6), the reconstructed video sequence typically may be a replica of the source video sequence with some errors. The local video decoder (633) replicates decoding processes that may be performed by the video decoder on reference pictures and may cause reconstructed reference pictures to be stored in the reference picture cache (634). In this manner, the video encoder (603) may store copies of reconstructed reference pictures locally that have common content as the reconstructed reference pictures that will be obtained by a far-end video decoder (absent transmission errors).

The predictor (635) may perform prediction searches for the coding engine (632). That is, for a new picture to be coded, the predictor (635) may search the reference picture memory (634) for sample data (as candidate reference pixel blocks) or certain metadata such as reference picture motion vectors, block shapes, and so on, that may serve as an appropriate prediction reference for the new pictures. The predictor (635) may operate on a sample block-by-pixel block basis to find appropriate prediction references. In some cases, as determined by search results obtained by the predictor (635), an input picture may have prediction references drawn from multiple reference pictures stored in the reference picture memory (634).

The controller (650) may manage coding operations of the source coder (630), including, for example, setting of parameters and subgroup parameters used for encoding the video data.

Output of all aforementioned functional units may be subjected to entropy coding in the entropy coder (645). The entropy coder (645) translates the symbols as generated by the various functional units into a coded video sequence, by lossless compressing the symbols according to technologies such as Huffman coding, variable length coding, arithmetic coding, and so forth.

The transmitter (640) may buffer the coded video sequence(s) as created by the entropy coder (645) to prepare for transmission via a communication channel (660), which may be a hardware/software link to a storage device which would store the encoded video data. The transmitter (640) may merge coded video data from the video coder (603) with other data to be transmitted, for example, coded audio data and/or ancillary data streams (sources not shown).

The controller (650) may manage operation of the video encoder (603). During coding, the controller (650) may assign to each coded picture a certain coded picture type, which may affect the coding techniques that may be applied to the respective picture. For example, pictures often may be assigned as one of the following picture types:

An Intra Picture (I picture) may be one that may be coded and decoded without using any other picture in the sequence as a source of prediction. Some video codecs allow for different types of intra pictures, including, for example Independent Decoder Refresh ("IDR") Pictures. A person skilled in the art is aware of those variants of I pictures and their respective applications and features.

A predictive picture (P picture) may be one that may be coded and decoded using intra prediction or inter prediction using at most one motion vector and reference index to predict the sample values of each block.

A bi-directionally predictive picture (B Picture) may be one that may be coded and decoded using intra prediction or inter prediction using at most two motion vectors and reference indices to predict the sample values of each block. Similarly, multiple-predictive pictures can use more than two reference pictures and associated metadata for the reconstruction of a single block.

Source pictures commonly may be subdivided spatially into a plurality of sample blocks (for example, blocks of 4×4, 8×8, 4×8, or 16×16 samples each) and coded on a block-by-block basis. Blocks may be coded predictively with reference to other (already coded) blocks as determined by the coding assignment applied to the blocks' respective pictures. For example, blocks of I pictures may be coded non-predictively or they may be coded predictively with reference to already coded blocks of the same picture (spatial prediction or intra prediction). Pixel blocks of P pictures may be coded predictively, via spatial prediction or via temporal prediction with reference to one previously coded reference picture. Blocks of B pictures may be coded predictively, via spatial prediction or via temporal prediction with reference to one or two previously coded reference pictures.

The video encoder (603) may perform coding operations according to a predetermined video coding technology or standard, such as ITU-T Rec. H.265. In its operation, the video encoder (603) may perform various compression operations, including predictive coding operations that exploit temporal and spatial redundancies in the input video sequence. The coded video data, therefore, may conform to a syntax specified by the video coding technology or standard being used.

In an embodiment, the transmitter (640) may transmit additional data with the encoded video. The source coder (630) may include such data as part of the coded video sequence. Additional data may comprise temporal/spatial/SNR enhancement layers, other forms of redundant data such as redundant pictures and slices, SEI messages, VUI parameter set fragments, and so on.

A video may be captured as a plurality of source pictures (video pictures) in a temporal sequence. Intra-picture prediction (often abbreviated to intra prediction) makes use of spatial correlation in a given picture, and inter-picture prediction makes uses of the (temporal or other) correlation between the pictures. In an example, a specific picture under encoding/decoding, which is referred to as a current picture, is partitioned into blocks. When a block in the current picture is similar to a reference block in a previously coded and still buffered reference picture in the video, the block in the current picture can be coded by a vector that is referred to as a motion vector. The motion vector points to the reference block in the reference picture, and can have a third dimension identifying the reference picture, in case multiple reference pictures are in use.

In some embodiments, a bi-prediction technique can be used in the inter-picture prediction. According to the bi-prediction technique, two reference pictures, such as a first reference picture and a second reference picture that are both prior in decoding order to the current picture in the video (but may be in the past and future, respectively, in display order) are used. A block in the current picture can be coded by a first motion vector that points to a first reference block in the first reference picture, and a second motion vector that points to a second reference block in the second reference picture. The block can be predicted by a combination of the first reference block and the second reference block.

Further, a merge mode technique can be used in the inter-picture prediction to improve coding efficiency.

According to some embodiments of the disclosure, predictions, such as inter-picture predictions and intra-picture predictions are performed in the unit of blocks. For example, according to the HEVC standard, a picture in a sequence of video pictures is partitioned into coding tree units (CTU) for compression, the CTUs in a picture have the same size, such as 64×64 pixels, 32×32 pixels, or 16×16 pixels. In general, a CTU includes three coding tree blocks (CTBs), which are one luma CTB and two chroma CTBs. Each CTU can be recursively quadtree split into one or multiple coding units (CUs). For example, a CTU of 64×64 pixels can be split into one CU of 64×64 pixels, or 4 CUs of 32×32 pixels, or 16 CUs of 16×16 pixels. In an example, each CU is analyzed to determine a prediction type for the CU, such as an inter prediction type or an intra prediction type. The CU is split into one or more prediction units (PUs) depending on the temporal and/or spatial predictability. Generally, each PU includes a luma prediction block (PB), and two chroma PBs. In an embodiment, a prediction operation in coding (encoding/decoding) is performed in the unit of a prediction block. Using a luma prediction block as an example of a prediction block, the prediction block includes a matrix of values (e.g., luma values) for pixels, such as 8×8 pixels, 16×16 pixels, 8×16 pixels, 16×8 pixels, and the like.

Figure 7:
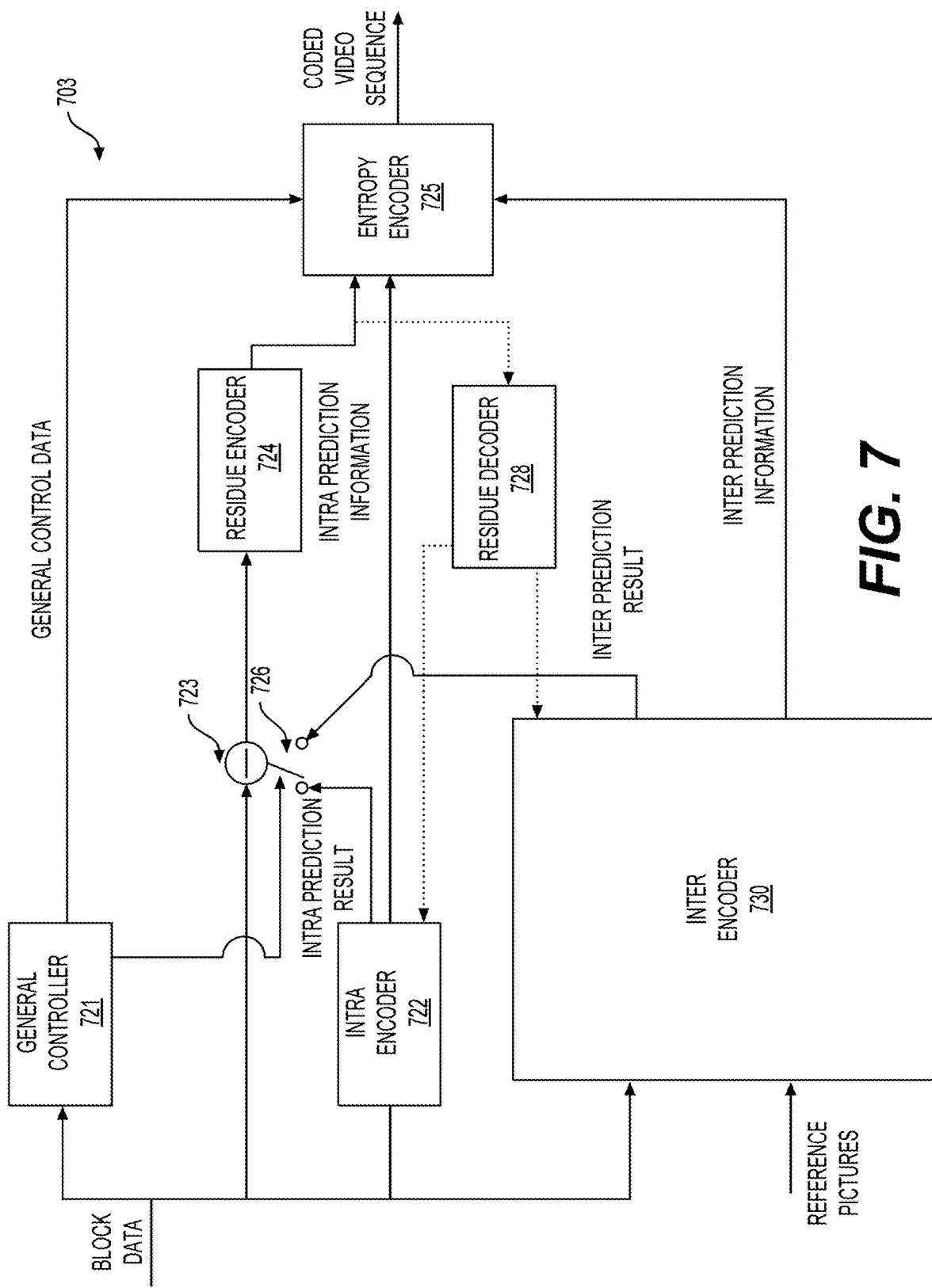
FIG. 7 shows a block diagram of an encoder in accordance with another embodiment.

FIG. 7 shows a diagram of a video encoder (703) according to another embodiment of the disclosure. The video encoder (703) is configured to receive a processing block (e.g., a prediction block) of sample values within a current video picture in a sequence of video pictures, and encode the processing block into a coded picture that is part of a coded video sequence. In an example, the video encoder (703) is used in the place of the video encoder (403) in the FIG. 4 example.

In an HEVC example, the video encoder (703) receives a matrix of sample values for a processing block, such as a prediction block of 8×8 samples, and the like. The video encoder (703) determines whether the processing block is best coded using intra mode, inter mode, or bi-prediction mode using, for example, rate-distortion optimization. When the processing block is to be coded in intra mode, the video encoder (703) may use an intra prediction technique to encode the processing block into the coded picture; and when the processing block is to be coded in inter mode or bi-prediction mode, the video encoder (703) may use an inter prediction or bi-prediction technique, respectively, to encode the processing block into the coded picture. In certain video coding technologies, merge mode can be an inter picture prediction submode where the motion vector is derived from one or more motion vector predictors without the benefit of a coded motion vector component outside the predictors. In certain other video coding technologies, a motion vector component applicable to the subject block may be present. In an example, the video encoder (703) includes other components, such as a mode decision module (not shown) to determine the mode of the processing blocks.

In the FIG. 7 example, the video encoder (703) includes the inter encoder (730), an intra encoder (722), a residue calculator (723), a switch (726), a residue encoder (724), a general controller (721), and an entropy encoder (725) coupled together as shown in FIG. 7.

The inter encoder (730) is configured to receive the samples of the current block (e.g., a processing block), compare the block to one or more reference blocks in reference pictures (e.g., blocks in previous pictures and later pictures), generate inter prediction information (e.g., description of redundant information according to inter encoding technique, motion vectors, merge mode information), and calculate inter prediction results (e.g., predicted block) based on the inter prediction information using any suitable technique. In some examples, the reference pictures are decoded reference pictures that are decoded based on the encoded video information.

The intra encoder (722) is configured to receive the samples of the current block (e.g., a processing block), in some cases compare the block to blocks already coded in the same picture, generate quantized coefficients after transform, and in some cases also intra prediction information (e.g., an intra prediction direction information according to one or more intra encoding techniques). In an example, the intra encoder (722) also calculates intra prediction results (e.g., predicted block) based on the intra prediction information and reference blocks in the same picture.

The general controller (721) is configured to determine general control data and control other components of the video encoder (703) based on the general control data. In an example, the general controller (721) determines the mode of the block, and provides a control signal to the switch (726) based on the mode. For example, when the mode is the intra mode, the general controller (721) controls the switch (726) to select the intra mode result for use by the residue calculator (723), and controls the entropy encoder (725) to select the intra prediction information and include the intra prediction information in the bitstream; and when the mode is the inter mode, the general controller (721) controls the switch (726) to select the inter prediction result for use by the residue calculator (723), and controls the entropy encoder (725) to select the inter prediction information and include the inter prediction information in the bitstream.

The residue calculator (723) is configured to calculate a difference (residue data) between the received block and prediction results selected from the intra encoder (722) or the inter encoder (730). The residue encoder (724) is configured to operate based on the residue data to encode the residue data to generate the transform coefficients. In an example, the residue encoder (724) is configured to convert the residue data from a spatial domain to a frequency domain, and generate the transform coefficients. The transform coefficients are then subject to quantization processing to obtain quantized transform coefficients. In various embodiments, the video encoder (703) also includes a residue decoder (728). The residue decoder (728) is configured to perform inverse-transform, and generate the decoded residue data. The decoded residue data can be suitably used by the intra encoder (722) and the inter encoder (730). For example, the inter encoder (730) can generate decoded blocks based on the decoded residue data and inter prediction information, and the intra encoder (722) can generate decoded blocks based on the decoded residue data and the intra prediction information. The decoded blocks are suitably processed to generate decoded pictures and the decoded pictures can be buffered in a memory circuit (not shown) and used as reference pictures in some examples.

The entropy encoder (725) is configured to format the bitstream to include the encoded block. The entropy encoder (725) is configured to include various information according to a suitable standard, such as the HEVC standard. In an example, the entropy encoder (725) is configured to include the general control data, the selected prediction information (e.g., intra prediction information or inter prediction information), the residue information, and other suitable information in the bitstream. Note that, according to the disclosed subject matter, when coding a block in the merge submode of either inter mode or bi-prediction mode, there is no residue information.

Figure 8:
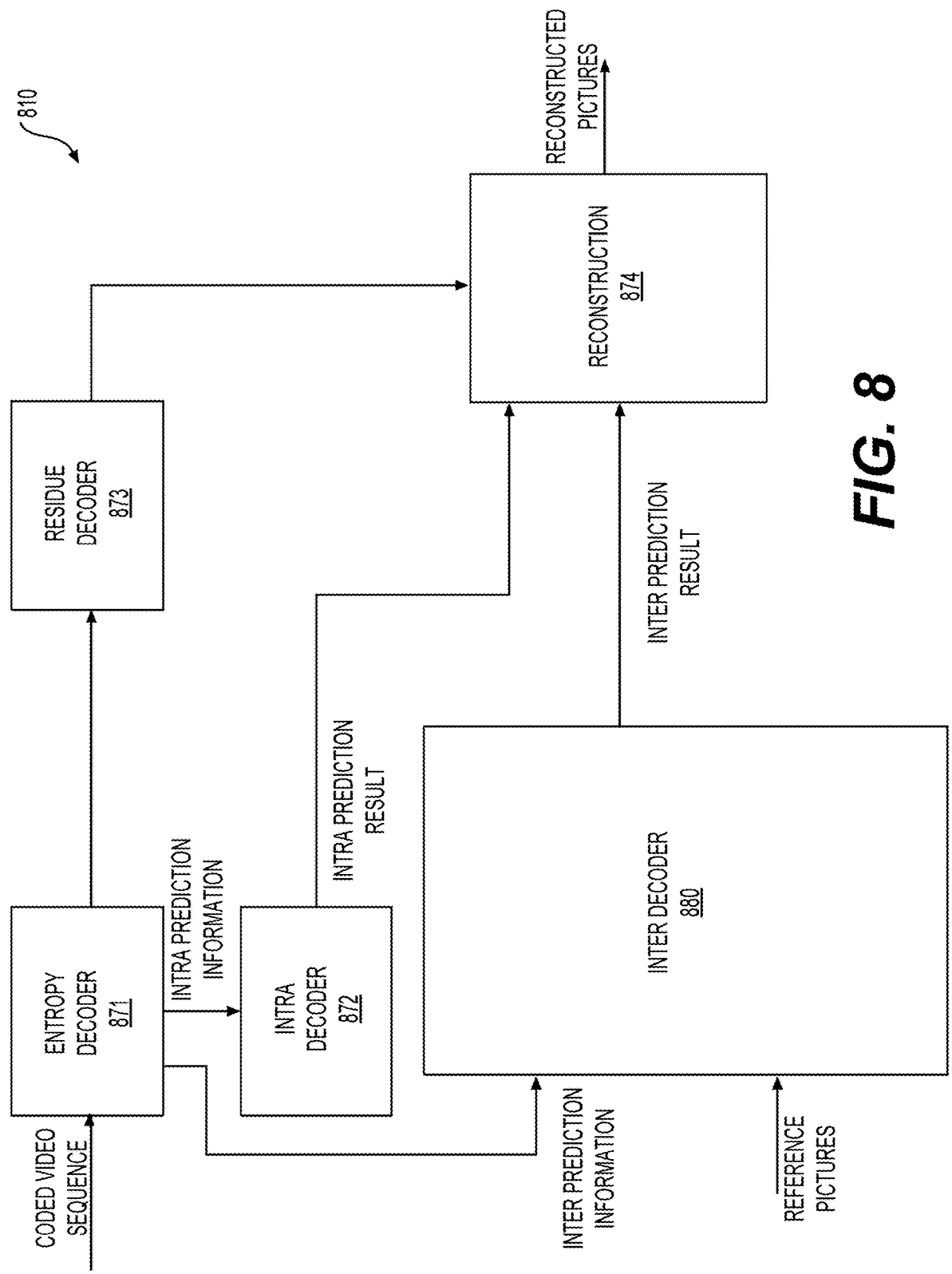
FIG. 8 shows a block diagram of a decoder in accordance with another embodiment.

FIG. 8 shows a diagram of a video decoder (810) according to another embodiment of the disclosure. The video decoder (810) is configured to receive coded pictures that are part of a coded video sequence, and decode the coded pictures to generate reconstructed pictures. In an example, the video decoder (810) is used in the place of the video decoder (410) in the FIG. 4 example.

In the FIG. 8 example, the video decoder (810) includes an entropy decoder (871), an inter decoder (880), a residue decoder (873), a reconstruction module (874), and an intra decoder (872) coupled together as shown in FIG. 8.

The entropy decoder (871) can be configured to reconstruct, from the coded picture, certain symbols that represent the syntax elements of which the coded picture is made up. Such symbols can include, for example, the mode in which a block is coded (such as, for example, intra mode, inter mode, bi-predicted mode, the latter two in merge submode or another submode), prediction information (such as, for example, intra prediction information or inter prediction information) that can identify certain sample or metadata that is used for prediction by the intra decoder (872) or the inter decoder (880), respectively, residual information in the form of, for example, quantized transform coefficients, and the like. In an example, when the prediction mode is inter or bi-predicted mode, the inter prediction information is provided to the inter decoder (880); and when the prediction type is the intra prediction type, the intra prediction information is provided to the intra decoder (872). The residual information can be subject to inverse quantization and is provided to the residue decoder (873).

The inter decoder (880) is configured to receive the inter prediction information, and generate inter prediction results based on the inter prediction information.

The intra decoder (872) is configured to receive the intra prediction information, and generate prediction results based on the intra prediction information.

The residue decoder (873) is configured to perform inverse quantization to extract de-quantized transform coefficients, and process the de-quantized transform coefficients to convert the residual from the frequency domain to the spatial domain. The residue decoder (873) may also require certain control information (to include the Quantizer Parameter (QP)), and that information may be provided by the entropy decoder (871) (data path not depicted as this may be low volume control information only).

The reconstruction module (874) is configured to combine, in the spatial domain, the residual as output by the residue decoder (873) and the prediction results (as output by the inter or intra prediction modules as the case may be) to form a reconstructed block, that may be part of the reconstructed picture, which in turn may be part of the reconstructed video. It is noted that other suitable operations, such as a deblocking operation and the like, can be performed to improve the visual quality.

It is noted that the video encoders (403), (603), and (703), and the video decoders (410), (510), and (810) can be implemented using any suitable technique. In an embodiment, the video encoders (403), (603), and (703), and the video decoders (410), (510), and (810) can be implemented using one or more integrated circuits. In another embodiment, the video encoders (403), (603), and (603), and the video decoders (410), (510), and (810) can be implemented using one or more processors that execute software instructions.

Block based compensation can be used for inter prediction and intra prediction. For the inter prediction, block based compensation from a different picture is known as motion compensation. Block based compensation can also be done from a previously reconstructed area within the same picture, such as in intra prediction. The block based compensation from reconstructed area within the same picture is referred to as intra picture block compensation, current picture referencing (CPR), or intra block copy (IBC). A displacement vector that indicates an offset between a current block and a reference block (also referred to as a prediction block) in the same picture is referred to as a block vector (BV) where the current block can be encoded/decoded based on the reference block. Different from a motion vector in motion compensation, which can be at any value (positive or negative, at either x or y direction), a BV has a few constraints to ensure that the reference block is available and already reconstructed. Also, in some examples, for parallel processing consideration, some reference area that is tile boundary, slice boundary, or wavefront ladder shape boundary is excluded.

The coding of a block vector could be either explicit or implicit. In the explicit mode, a BV difference between a block vector and its predictor is signaled. In the implicit mode, the block vector is recovered from a predictor (referred to as block vector predictor) without using the BV difference, in a similar way as a motion vector in the merge mode. The explicit mode can be referred to as a non-merge BV prediction mode. The implicit mode can be referred to as a merge BV prediction mode.

The resolution of a block vector, in some implementations, is restricted to integer positions. In other systems, the block vector is allowed to point to fractional positions.

In some examples, the use of intra block copy at a block level can be signaled using a block level flag, such as an IBC flag. In an embodiment, the block level flag is signaled when the current block is coded explicitly. In some examples, the use of intra block copy at a block level can be signaled using a reference index approach. The current picture under decoding is then treated as a reference picture or a special reference picture. In an example, such a reference picture is put in the last position of a list of reference pictures. The special reference picture is also managed together with other temporal reference pictures in a buffer, such as a decoded picture buffer (DPB).

Figure 1A:
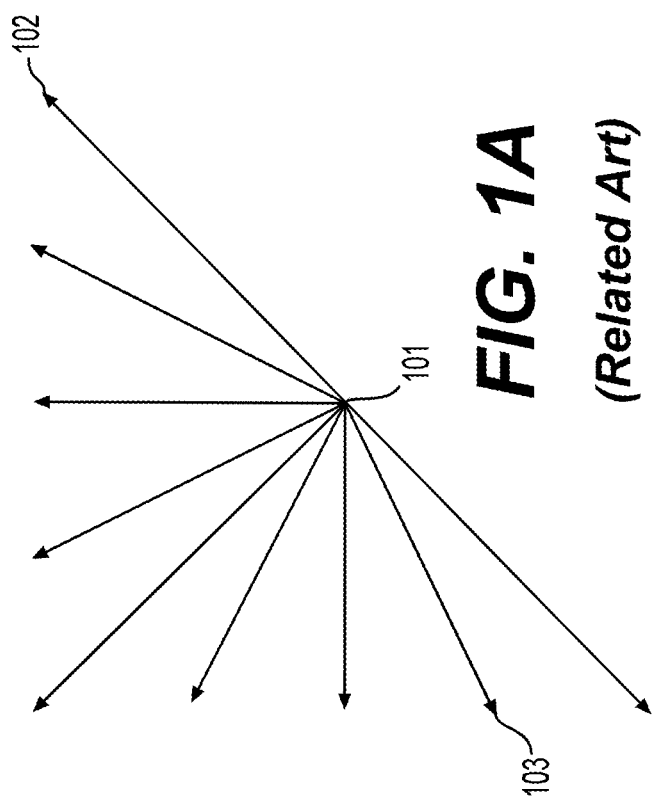
FIG. 1A is a schematic illustration of an exemplary subset of intra prediction modes.
Figure 1B:
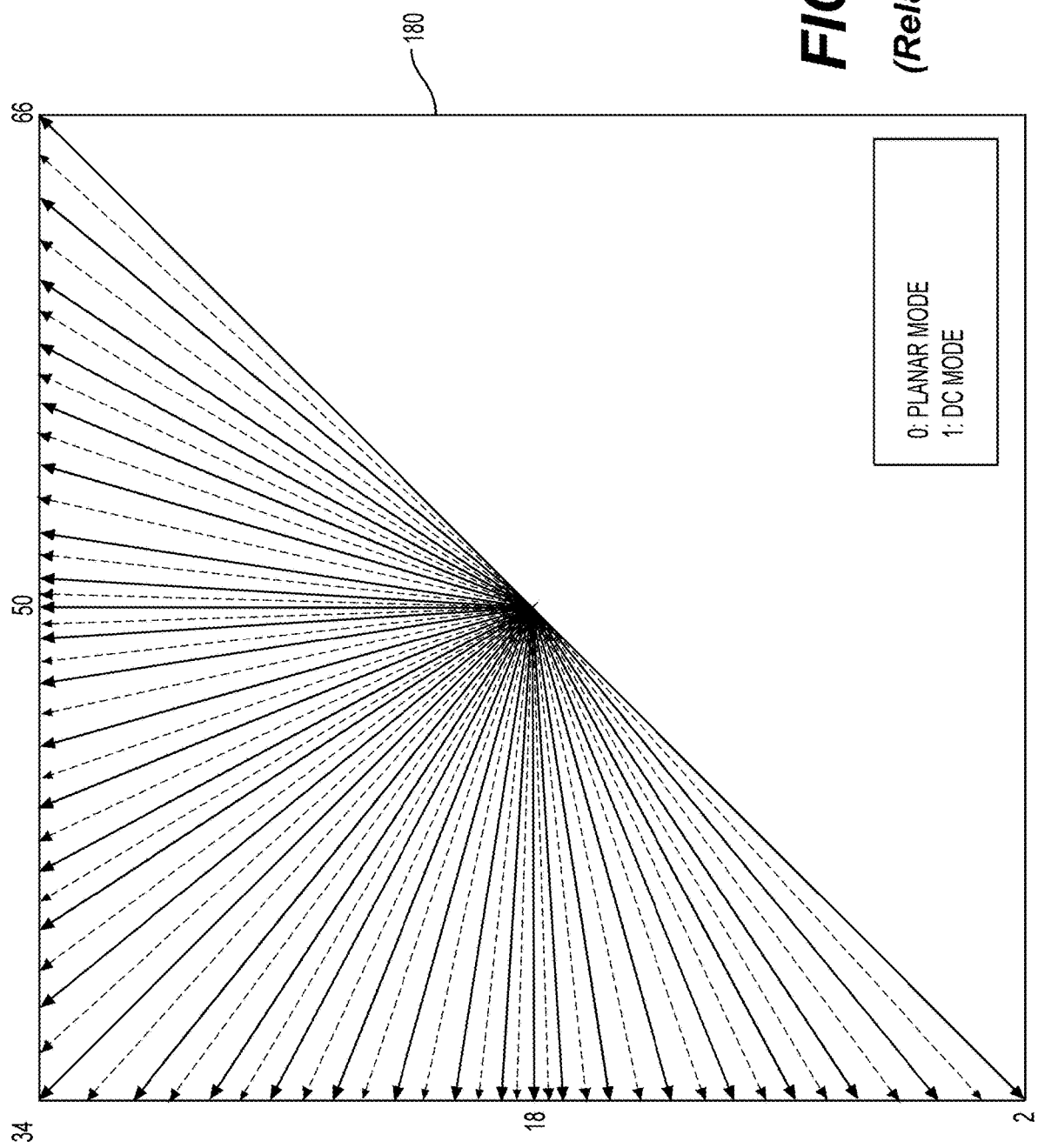
FIG. 1B is an illustration of exemplary intra prediction directions.
Figure 2:
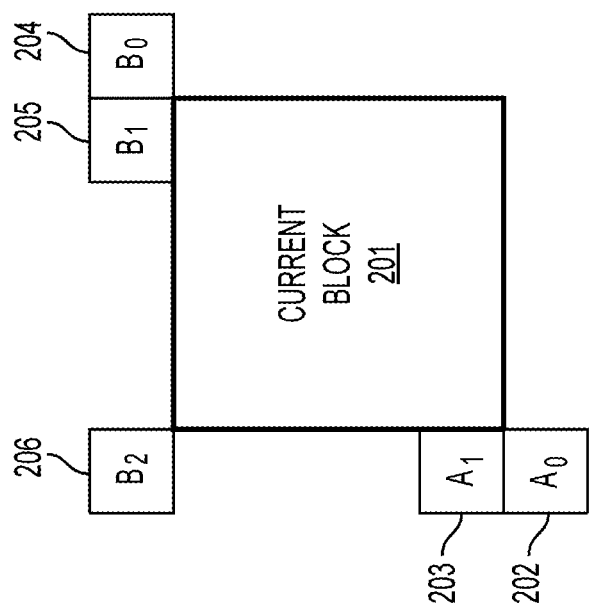
FIG. 2 is a schematic illustration of a current block and its surrounding spatial merge candidates in one example.

There can be variations for the IBC mode. In an example, the IBC mode is treated as a third mode that is different from the intra prediction mode and the inter prediction mode. Accordingly, the BV prediction in the implicit mode (or the merge mode) and the explicit mode are separated from the regular inter mode. A separate merge candidate list can be defined for the IBC mode where entries in the separate merge candidate list are BVs. Similarly, in an example, a BV prediction candidate list in the IBC explicit mode only includes BVs. General rules applied to the two lists (i.e., the separate merge candidate list and the BV prediction candidate list) are that the two lists may follow the same logic as a merge candidate list used in the regular merge mode or an AMVP predictor list used in the regular AMVP mode in terms of the candidate derivation process. For example, the five spatial neighboring locations (e.g., A0, A1, and B0, B1, B2 in FIG. 2), for example, HEVC or VVC inter merge mode are accessed for the IBC mode to derive the separate merge candidate list for the IBC mode.

As described above, a BV of a current block under reconstruction in a picture can have certain constraints, and thus, a reference block for the current block is within a search range. The search range refers to a part of the picture from which the reference block can be selected. For example, the search range may be within certain portions of a reconstructed area in the picture. A size, a position, a shape, and/or the like of the search range can be constrained. Alternatively, the BV can be constrained. In an example, the BV is a two-dimensional vector including an x and a y component, and at least one of the x and y components can be constrained. Constraints can be specified with respect to the BV, the search range, or a combination of the BV and the search range. In various examples, when certain constraints are specified with respect to the BV, the search range is constrained accordingly. Similarly, when certain constraints are specified with respect to the search range, the BV is constrained accordingly.

Figure 9:
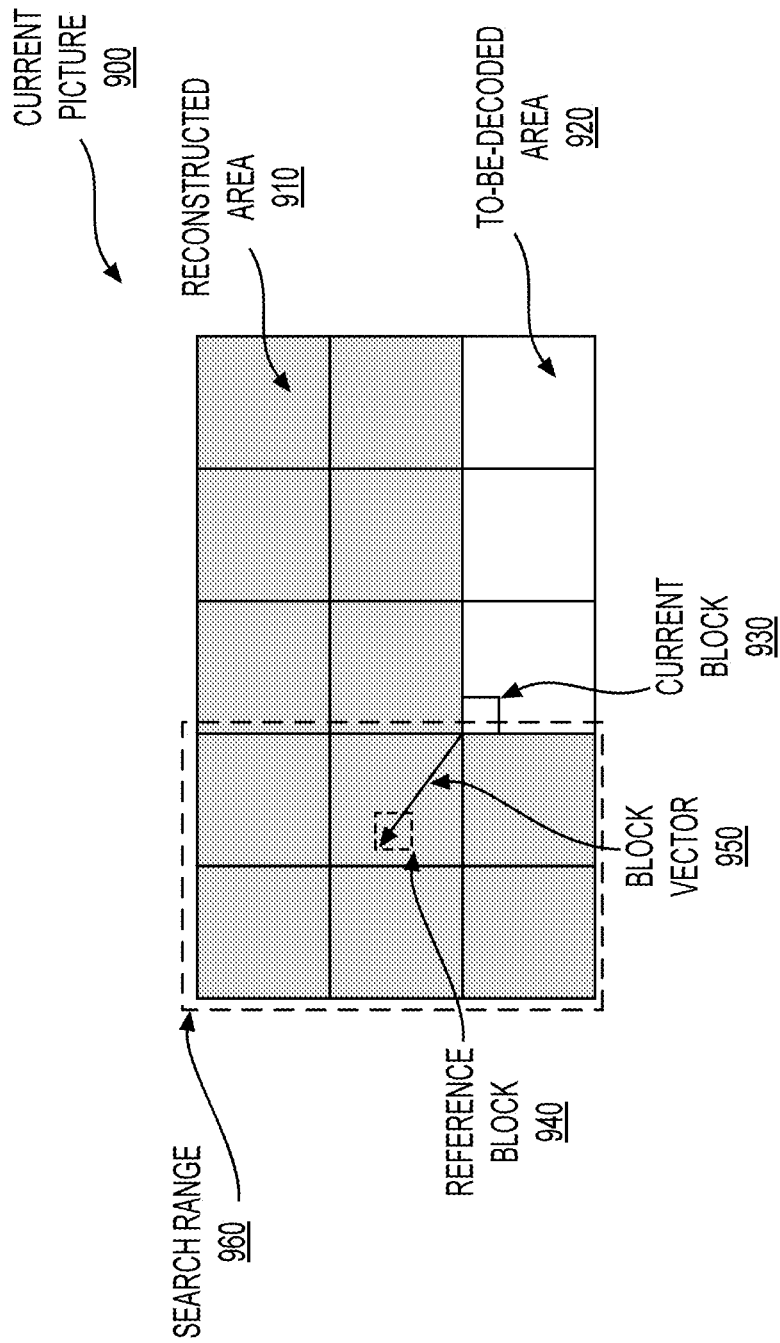
FIG. 9 shows an example of intra block copy according to an embodiment of the disclosure.

FIG. 9 shows an example of intra block copy according to an embodiment of the disclosure. A current picture (900) is to be reconstructed under decoding. The current picture (900) includes a reconstructed area (910) (grey area) and a to-be-decoded area (920) (white area). A current block (930) is under reconstruction by a decoder. The current block (930) can be reconstructed from a reference block (940) that is in the reconstructed area (910). A position offset between the reference block (940) and the current block (930) is referred to as a block vector (950) (or BV (950)). In the FIG. 9 example, a search range (960) is within the reconstructed area (910), the reference block (940) is within the search range (960), and the block vector (950) is constrained to point to the reference block (940) within the search range (960).

Various constraints can be applied to a BV and/or a search range. In an embodiment, a search range for a current block under reconstruction in a current CTB is constrained to be within the current CTB.

In an embodiment, an effective memory requirement to store reference samples to be used in intra block copy is one CTB size. In an example, the CTB size is 128×128 samples. A current CTB includes a current region under reconstruction. The current region has a size of 64×64 samples. Since a reference memory can also store reconstructed samples in the current region, the reference memory can store 3 more regions of 64×64 samples when a reference memory size is equal to the CTB size of 128×128 samples. Accordingly, a search range can include certain parts of a previously reconstructed CTB while a total memory requirement for storing reference samples is unchanged (such as 1 CTB size of 128×128 samples or 4 64×64 reference samples in total). In an example, the previously reconstructed CTB is a left neighbor of the current CTB, such as shown in FIG. 10.

Figure 10:
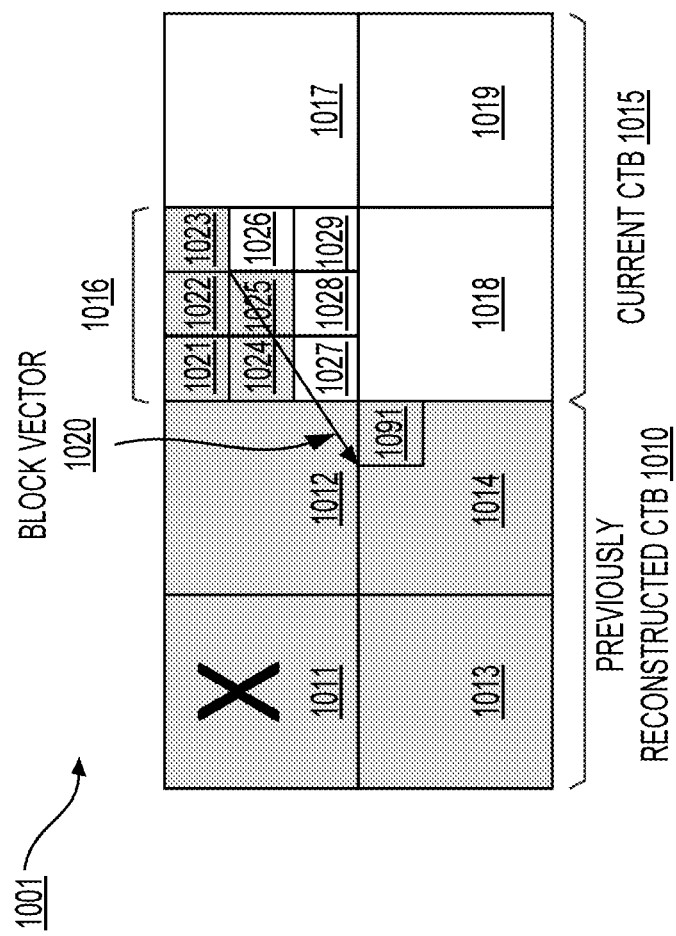
FIG. 10 shows an example of intra block copy according to an embodiment of the disclosure.

FIG. 10 shows an example of intra block copy according to an embodiment of the disclosure. A current picture (1001) includes a current CTB (1015) under reconstruction and a previously reconstructed CTB (1010) that is a left neighbor of the current CTB (1015). CTBs in the current picture (1001) have a CTB size, such as 128×128 samples, and a CTB width, such as 128 samples. The current CTB (1015) includes 4 regions (1016)-(1019), where the current region (1016) is under reconstruction. The current region (1016) includes a plurality of coding blocks (1021)-(1029). Similarly, the previously reconstructed CTB (1010) includes 4 regions (1011)-(1014). The coding blocks (1021)-(1025) are reconstructed, the current block (1026) is under reconstruction, and the coding blocks (1026)-(1027) and the regions (1017)-(1019) are to be reconstructed.

The current region (1016) has a collocated region (i.e., the region (1011), in the previously reconstructed CTB (1010)). A relative position of the collocated region (1011) with respect to the previously reconstructed CTB (1010) can be identical to a relative position of the current region (1016) with respect to the current CTB (1015). In the example illustrated in FIG. 10, the current region (1016) is a top left region in the current CTB (1015), and thus, the collocated region (1011) is also a top left region in the previously reconstructed CTB (1010). Since a position of the previously reconstructed CTB (1010) is offset from a position of the current CTB (1015) by the CTB width, a position of the collocated region (1011) is offset from a position of the current region (1016) by the CTB width.

In an embodiment, a collocated region of the current region (1016) is in a previously reconstructed CTB where a position of the previously reconstructed CTB is offset by one or multiples of the CTB width from the positon of the current CTB (1015), and thus, a position of the collocated region is also offset by a corresponding one or multiples of the CTB width from the position of the current region (1016). The position of the collocated region can be left shifted, up shifted, or the like from the current region (1016).

As described above, a size of a search range for the current block (1026) is constrained by the CTB size. In the FIG. 10 example, the search range can include the regions (1012)-(1014) in the previously reconstructed CTB (1010) and a portion of the current region (1016) that is already reconstructed, such as the coding blocks (1021)-(1025). The search range further excludes the collocated region (1011) so that the size of the search range is within the CTB size. Referring to FIG. 10, a reference block (1091) is located in the region (1014) of the previously reconstructed CTB (1010). A block vector (1020) indicates an offset between the current block (1026) and the respective reference block (1091). The reference block (1091) is in the search range.

The example illustrated in FIG. 10 can be suitably adapted to other scenarios where a current region is located at another location in the current CTB (1015). In an example, when a current block is in the region (1017), a collocated region for the current block is the region (1012). Therefore, a search range can include the regions (1013)-(1014), the region (1016), and a portion of the region (1017) that is already reconstructed. The search range further excludes the region (1011) and the collocated region (1012) so that the size of the search range is within the CTB size. In an example, when a current block is in the region (1018), a collocated region for the current block is the region (1013). Therefore, a search range can include the region (1014), the regions (1016)-(1017), and a portion of the region (1018) that is already reconstructed. The search range further excludes the regions (1011)-(1012) and the collocated region (1013) so that the size of the search range is within the CTB size. In an example, when a current block is in the region (1019), a collocated region for the current block is the region (1014). Therefore, a search range can include the regions (1016)-(1018), and a portion of the region (1019) that is already reconstructed. The search range further excludes the previously reconstructed CTB (1010) so that the size of the search range is within the CTB size.

In the above description, a reference block can be in the previously reconstructed CTB (1010) or the current CTB (1015).

In an embodiment, a search range can be specified as below. In an example, a current picture is a luma picture and a current CTB is a luma CTB including a plurality of luma samples and a BV (mvL) satisfies the following constraints for bitstream conformance. In an example, the BV (mvL) has a fractional resolution (e.g., $\frac{1}{16}$-pel resolution).

The constraints include first conditions that a reference block for the current block is already reconstructed. When the reference block has a rectangular shape, a neighboring block availability checking process (or a reference block availability checking process) can be implemented to check whether a top left sample and a bottom right sample of the reference block are reconstructed. When both the top left sample and the bottom right sample of the reference block are reconstructed, the reference block is determined to be reconstructed.

For example, when a derivation process for reference block availability is invoked with a position (xCurr, yCurr) of a top left sample of the current block set to be (xCb, yCb) and a position (xCb+(mvL[0]>>4), yCb+(mvL[1]>>4)) of the top left sample of the reference block as inputs, an output is equal to TRUE when the top left sample of the reference block is reconstructed where the block vector mvL is a two-dimensional vector having a x component mvL[0] and a y component mvL[1]. When the BV (mvL) has a fractional resolution, such as $\frac{1}{16}$-pel resolution, the x component mvL[0] and the y component mvL[1] are shifted to have an integer resolution, as indicated by mvL[0]>>4 and mvL[1]>>4, respectively.

Similarly, when a derivation process for block availability is invoked with the position (xCurr, yCurr) of the top left sample of the current block set to be (xCb, yCb) and a position (xCb+(mvL[0]>>4)+cbWidth−1, yCb+(mvL[1]>>4)+cbHeight−1) of the bottom right sample of the reference block as inputs, an output is equal to TRUE when the bottom right sample of the reference block is reconstructed. The parameters cbWidth and cbHeight represent a width and a height of the reference block.

The constraints can also include at least one of the following second conditions: 1) a value of (mvL[0]>>4)+cbWidth is less than or equal to 0, which indicates that the reference block is to the left of the current block and does not overlap with the current block; 2) a value of (mvL[1]>>4)+cbHeight is less than or equal to 0, which indicates that the reference block is above the current block and does not overlap with the current block.

The constraints can also include that the following third conditions are satisfied by the block vector mvL:

$$(yCb+(mvL[1]>>4))>>Ctb\,Log\,2SizeY = yCb>>Ctb\,Log\,2SizeY \quad (1)$$

$$(yCb+(mvL[1]>>4+cbHeight-1)>>Ctb\,Log\,2SizeY = yCb>>Ctb\,Log\,2Size \quad (2)$$

$$(xCb+(mvL[0]>>4))>>Ctb\,Log\,2SizeY >= (xCb>>Ctb\,Log\,2SizeY)-1 \quad (3)$$

$$(xCb+(mvL[0]>>4)+cbWidth-1)>>Ctb\,Log\,2SizeY\,(xCb>>Ctb\,Log\,2SizeY) \quad (4)$$

where the parameters CtbLog2SizeY represents the CTB width in log 2 form. For example, when the CTB width is 128 samples, CtbLog2SizeY is 7. Eqs. (1)-(2) specify that a CTB including the reference block is in a same CTB row as the current CTB (e.g., the previously reconstructed CTB (1010) is in a same row as the current CTB (1015) when the reference block is in the previously reconstructed CTB (1010)). Eqs. (3)-(4) specify that the CTB including the reference block is either in a left CTB column of the current CTB or a same CTB column as the current CTB. The third conditions as described by Eqs. (1)-(4) specify that the CTB including the reference block is either the current CTB, such as the current CTB (1015), or a left neighbor, such as the previously reconstructed CTB (1010), of the current CTB, similarly to the description with reference to FIG. 10.

The constraints can further include fourth conditions: when the reference block is in the left neighbor of the current CTB, a collocated region for the reference block is not reconstructed (i.e., no samples in the collocated region have been reconstructed). Further, the collocated region for the reference block is in the current CTB. In the FIG. 10 example, a collocated region for the reference block (1091) is the region (1019) that is offset by the CTB width from the region (1014) where the reference block (1091) is located and the region (1019) has not been reconstructed. Therefore, the block vector (1020) and the reference block (1091) satisfy the fourth conditions described above.

In an example, the fourth conditions can be specified as below: when (xCb+(mvL[0]>>4))>>CtbLog2SizeY is equal to (xCb>>CtbLog2SizeY)−1, the derivation process for reference block availability is invoked with the position of the current block (xCurr, yCurr) set to be (xCb, yCb) and a position (((xCb+(mvL[0]>>4)+CtbSizeY)>>(CtbLog2SizeY−1))<<(CtbLog2SizeY−1), ((yCb+(mvL[1]>>4))>>(CtbLog2SizeY−1))<<(CtbLog2SizeY−1)) as inputs, an output is equal to FALSE indicating that the collocated region is not reconstructed, such as shown in FIG. 10.

The constraints for the search range and/or the block vector can include a suitable combination of the first, second, third, and fourth conditions described above. In an example, the constraints include the first, second, third, and fourth conditions, such as shown in FIG. 10. In an example, the first, second, third, and/or fourth conditions can be modified and the constraints include the modified first, second, third, and/or fourth conditions.

According to the fourth conditions, when one of the coding blocks (1022)-(1029) is a current block, a reference block cannot be in the region (1011), and thus, a search range for the one of the coding blocks (1022)-(1029) excludes the region (1011). The reasons why the region (1011) is excluded are specified below: if the reference block is in the region (1011), then a collocated region for the reference block is the region (1016), however, at least samples in the coding block (1021) have been reconstructed, and thus, the fourth conditions are violated. On the other hand, for a coding block to be reconstructed first in a current region, such as a coding block (1121) in a region (1116) in FIG. 11, the fourth conditions does not prevent a reference block to be in the region (1111) because a collocated region (1116) for the reference block has not been reconstructed yet.

Figure 11:
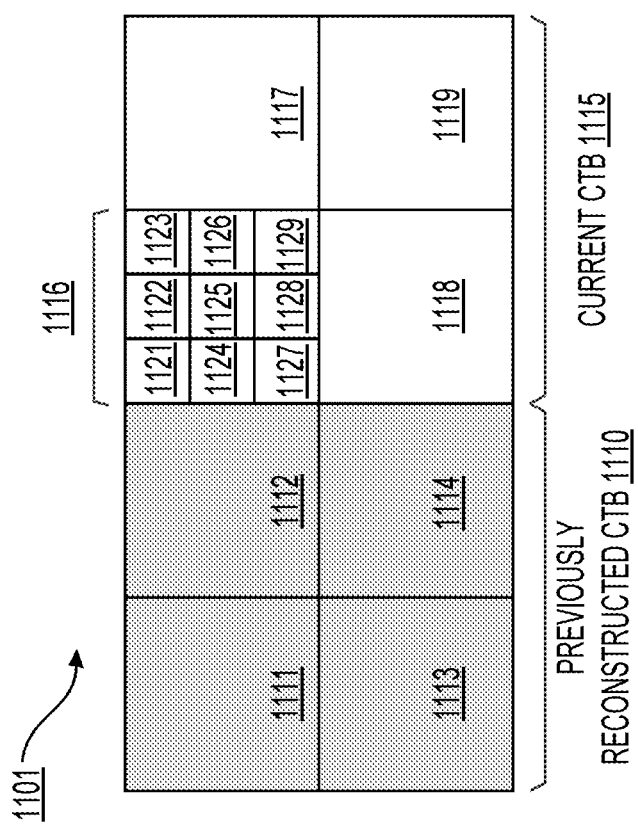
FIG. 11 shows an example of intra block copy according to an embodiment of the disclosure.

FIG. 11 shows an example of intra block copy according to an embodiment of the disclosure. A current picture (1101) includes a current CTB (1115) under reconstruction and a previously reconstructed CTB (1110) that is a left neighbor of the current CTB (1115). CTBs in the current picture (1101) have a CTB size and a CTB width. The current CTB (1115) includes 4 regions (1116)-(1119) where the current region (1116) is under reconstruction. The current region (1116) includes a plurality of coding blocks (1121)-(1129). Similarly, the previously reconstructed CTB (1110) includes 4 regions (1111)-(1114). The current block (1121) under reconstruction is to be reconstructed first in the current region (1116) and the coding blocks (1122)-(1129) are to be reconstructed. In an example, the CTB size is 128×128 samples, each of the regions (1111)-(1114) and (1116)-(1119) is 64×64 samples. A reference memory size is equal to the CTB size and is 128×128 samples, and thus, the search range, when bounded by the reference memory size, includes 3 regions and a portion of an additional region.

Similarly as described with reference to FIG. 10, the current region (1116) has a collocated region (i.e., the region (1111) in the previously reconstructed CTB (1110)). According to the fourth conditions described above, a reference block for the current block (1121) can be in the region (1111), and thus, a search range can include the regions (1111)-(1114). For example, when the reference block is in the region (1111), a collocated region of the reference block is the region (1116), where no samples in the region (1116) have been reconstructed prior to the reconstruction of the current block (1121). However, as described with reference to FIG. 10 and the fourth conditions, for example, after the reconstruction of the coding block (1121), the region (1111) is no longer available to be included in a search range for reconstructing the coding block (1122). Therefore, a tight synchronization and timing control of the reference memory buffer is to be used and can be challenging.

According to some embodiments, when a current block is to be reconstructed first in a current region of a current CTB, a search range can exclude a collocated region of the current region that is in a previously reconstructed CTB where the current CTB and the previously reconstructed CTB are in a same current picture. A block vector can be determined such that a reference block is in the search range that excludes the collocated region in the previously reconstructed CTB. In an embodiment, the search range includes coding blocks that are reconstructed after the collocated region and before the current block in a decoding order.

In the descriptions below, a CTB size can vary and a maximum CTB size is set to be identical to a reference memory size. In an example, the reference memory size or the maximum CTB size is 128×128 samples. The descriptions can be suitably adapted to other reference memory sizes or maximum CTB sizes.

In an embodiment, the CTB size is equal to the reference memory size. The previously reconstructed CTB is a left neighbor of the current CTB, a position of the collocated region is offset by a CTB width from a position of the current region, and the coding blocks in the search range are in at least one of: the current CTB and the previously reconstructed CTB.

FIGS. 12A-12D show examples of intra block copy according to an embodiment of the disclosure. Referring to FIGS. 12A-D, a current picture (1201) includes a current CTB (1215) under reconstruction and a previously reconstructed CTB (1210) that is a left neighbor of the current CTB (1215). CTBs in the current picture (1201) have a CTB size and a CTB width. The current CTB (1215) includes 4 regions (1216)-(1219). Similarly, the previously reconstructed CTB (1210) includes 4 regions (1211)-(1214). In an embodiment, the CTB size is a maximum CTB size and is equal to a reference memory size. In an example, the CTB size and the reference memory size are 128 by 128 samples, and thus, each of the regions (1211)-(1214) and (1216)-(1219) has a size of 64 by 64 samples.

In the examples illustrated in FIGS. 12A-D, the current CTB (1215) includes a top left region, a top right region, a bottom left region, and a bottom right region that correspond to the regions (1216)-(1219), respectively. The previously reconstructed CTB (1210) includes a top left region, a top right region, a bottom left region, and a bottom right region that correspond to the regions (1211)-(1214), respectively.

Figure 12A:
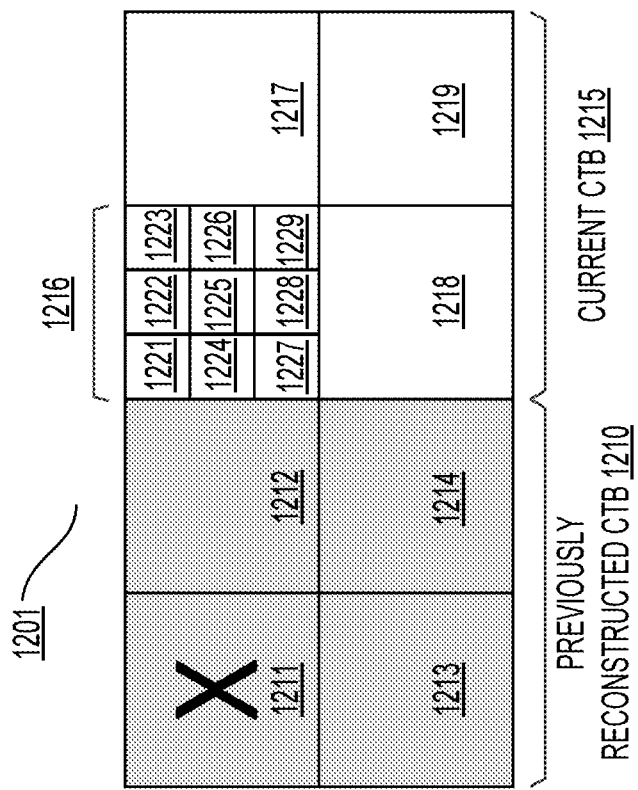

Referring to FIG. 12A, the current region (1216) is under reconstruction. The current region (1216) can include a plurality of coding blocks (1221)-(1229). The current region (1216) has a collocated region, i.e., the region (1211), in the previously reconstructed CTB (1210). A search range for one of the coding blocks (1221)-(1229) to be reconstructed can exclude the collocated region (1211). The search range can include the regions (1212)-(1214) of the previously reconstructed CTB (1210) that are reconstructed after the collocated region (1211) and before the current region (1216) in a decoding order.

Referring to FIG. 12A, a position of the collocated region (1211) is offset by the CTB width, such as 128 samples, from a position of the current region (1216). For example, the position of the collocated region (1211) is left shifted by 128 samples from the position of the current region (1216).

Referring again to FIG. 12A, when the current region (1216) is the top left region of the current CTB (1215), the collocated region (1211) is the top left region of the previously reconstructed CTB (1210), and the search region excludes the top left region of the previously reconstructed CTB.

Figure 12B:
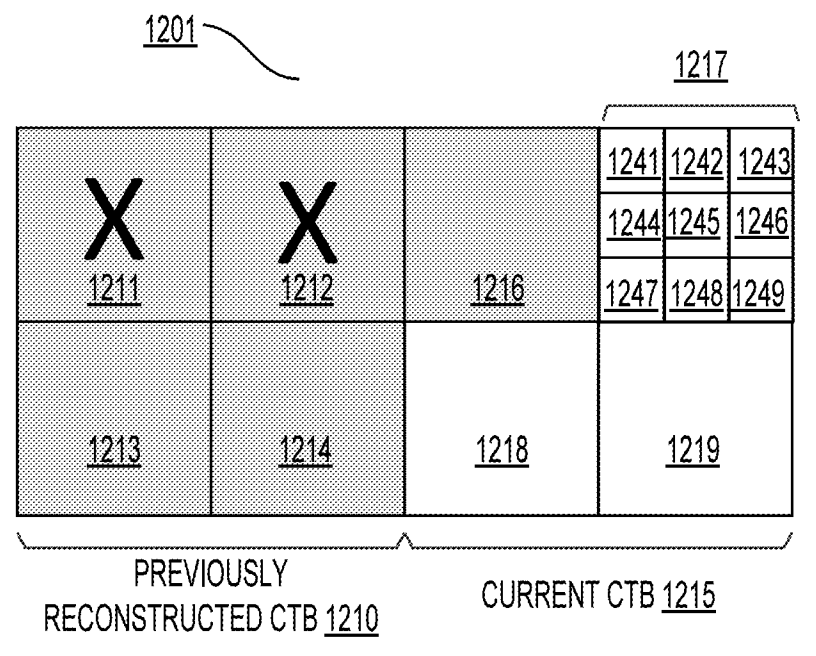

Referring to FIG. 12B, the current region (1217) is under reconstruction. The current region (1217) can include a plurality of coding blocks (1241)-(1249). The current region (1217) has a collocated region (i.e., the region (1212), in the previously reconstructed CTB (1210)). A search range for one of the plurality of coding blocks (1241)-(1249) can exclude the collocated region (1212). The search range includes the regions (1213)-(1214) of the previously reconstructed CTB (1210) and the region (1216) in the current CTB (1215) that are reconstructed after the collocated region (1212) and before the current region (1217). The search range further excludes the region (1211) due to constraint of the reference memory size (i.e., one CTB size). Similarly, a position of the collocated region (1212) is offset by the CTB width, such as 128 samples, from a position of the current region (1217).

In the FIG. 12B example, the current region (1217) is the top right region of the current CTB (1215), the collocated region (1212) is also the top right region of the previously reconstructed CTB (1210), and the search region excludes the top right region of the previously reconstructed CTB (1210).

Figure 12C:
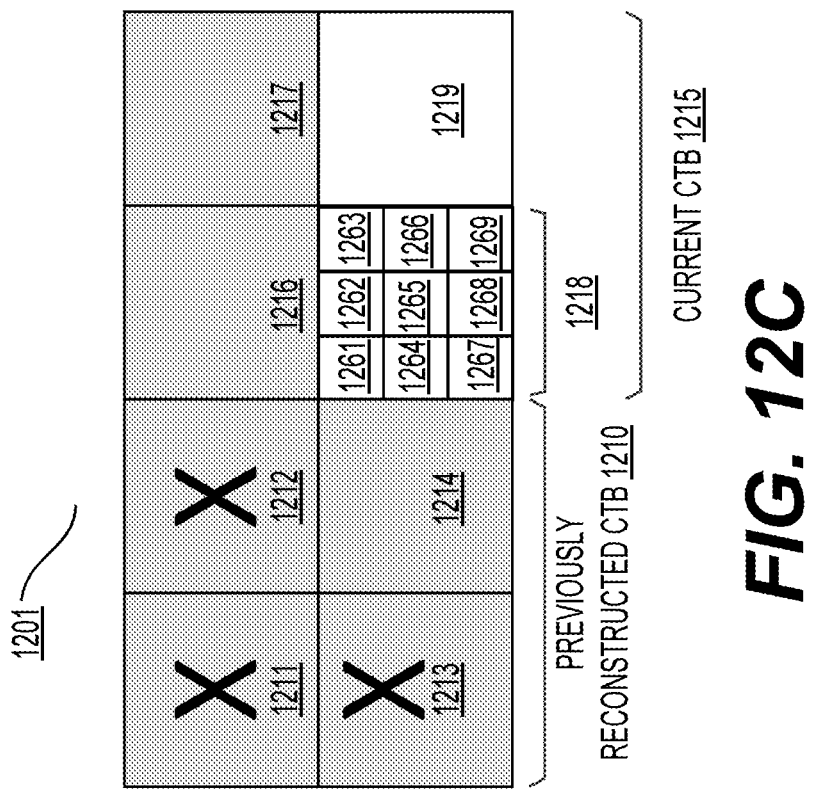

Referring to FIG. 12C, the current region (1218) is under reconstruction. The current region (1218) can include a plurality of coding blocks (1261)-(1269). The current region (1218) has a collocated region (i.e., the region (1213)), in the previously reconstructed CTB (1210). A search range for one of the plurality of coding blocks (1261)-(1269) can exclude the collocated region (1213). The search range includes the region (1214) of the previously reconstructed CTB (1210) and the regions (1216)-(1217) in the current CTB (1215) that are reconstructed after the collocated region (1213) and before the current region (1218). Similarly, the search range further excludes the regions (1211)-(1212) due to constraint of the reference memory size. A position of the collocated region (1213) is offset by the CTB width, such as 128 samples, from a position of the current region (1218). In the FIG. 12C example, when the current region (1218) is the bottom left region of the current CTB (1215), the collocated region (1213) is also the bottom left region of the previously reconstructed CTB (1210), and the search region excludes the bottom left region of the previously reconstructed CTB (1210).

Figure 12D:
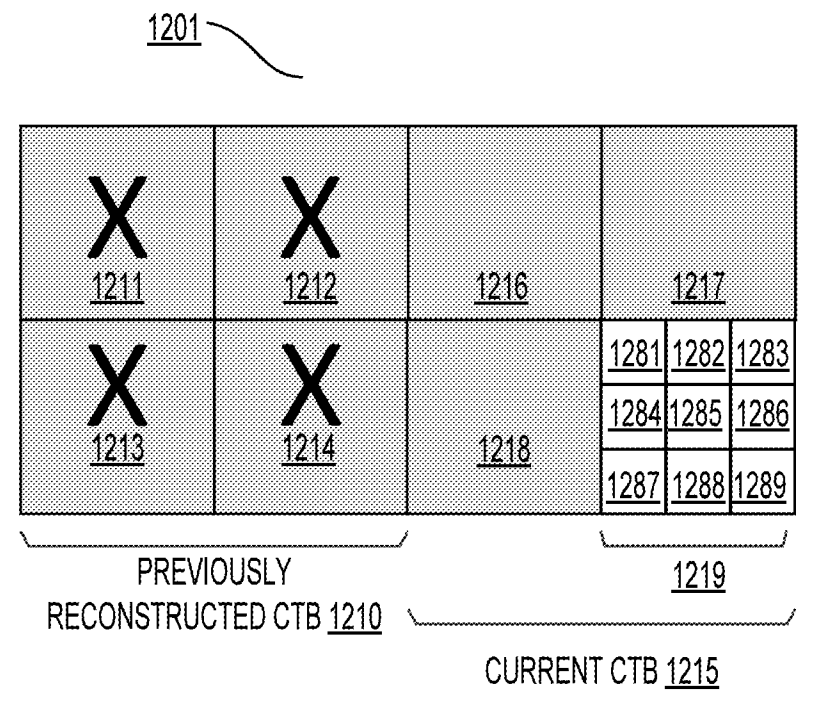

Referring to FIG. 12D, the current region (1219) is under reconstruction. The current region (1219) can include a plurality of coding blocks (1281)-(1289). The current region (1219) has a collocated region (i.e., the region (1214)), in the previously reconstructed CTB (1210). A search range for one of the plurality of coding blocks (1281)-(1289) can exclude the collocated region (1214). The search range includes the regions (1216)-(1218) in the current CTB (1215) that are reconstructed after the collocated region (1214) and before the current region (1219) in a decoding order. The search range excludes the regions (1211)-(1213) due to constraint of the reference memory size, and thus, the search range excludes the previously reconstructed CTB (1210). Similarly, a position of the collocated region (1214) is offset by the CTB width, such as 128 samples, from a position of the current region (1219). In the FIG. 12D example, when the current region (1219) is the bottom right region of the current CTB (1215), the collocated region (1214) is also the bottom right region of the previously reconstructed CTB (1210) and the search region excludes the bottom right region of the previously reconstructed CTB (1210).

Referring back to FIG. 2, the MVs associated with the five surrounding samples (or positions), denoted A0, A1, and B0, B1, B2 (202 through 206, respectively) can be referred to as spatial merge candidates. A candidate list (e.g., a merge candidate list) can be formed based on the spatial merge candidates. Any suitable order can be used to form the candidate list from the positions. In an example, the order can be A0, B0, B1, A1, and B2 where A0 is the first and B2 is the last. In an example, the order can be A1, B1, B0, A0, and B2 where A1 is the first and B2 is the last.

According to some embodiments, motion information of previously coded blocks for a current block (e.g., a coding block (CB) or a current CU) can be stored in a history-based motion vector prediction (HMVP) buffer (e.g., a table) to provide motion vector prediction (MVP) candidates (also referred to as HMVP candidates) for the current block. The HMVP buffer may include one or more HMVP candidates, and can be maintained during an encoding/a decoding process. In an example, a HMVP candidate in the HMVP buffer corresponds to the motion information of a previously coded block. The HMVP buffer can be used in any suitable encoder and/or decoder. HMVP candidate(s) can be added to a merge candidate list after spatial MVP(s) and TMVP(s).

The HMVP buffer can be reset (e.g., emptied) when a new CTU (or a new CTB) row is encountered. When there is a non-subblock inter-coded block, the associated motion information can be added to a last entry of the HMVP buffer as a new HMVP candidate.

In an example, such as in VTM3, a buffer size (denoted by S) of the HMVP buffer is set to be 6, indicating that up to 6 HMVP candidates may be added to the HMVP buffer. In some embodiments, the HMVP buffer may operate in a first-in-first-out (FIFO) rule, and thus, a piece of motion information (or a HMVP candidate) that is stored first in the HMVP buffer is the first to be removed from the HMVP buffer, for example, when the HMVP buffer is full. When inserting a new HMVP candidate to the HMVP buffer, a constrained FIFO rule can be utilized where a redundancy check is first applied to determine whether an identical or similar HMVP candidate is in the HMVP buffer. If an identical or similar HMVP candidate is determined to be in the HMVP buffer, the identical or similar HMVP candidate can be removed from the HMVP buffer and remaining HMVP candidates can be moved forward in the HMVP buffer.

The HMVP candidates can be used in a merge candidate list construction process, for example, in a merge mode. The most recent stored HMVP candidate(s) in the HMVP buffer can be checked in an order and inserted to the merge candidate list after the TMVP candidate(s). A redundancy check can be applied to the HMVP candidates with respect to the spatial or temporal merge candidates that are in the merge candidate list. The descriptions can be suitably adapted to an AMVP mode to construct an AMVP candidate list.

To reduce a number of redundancy check operations, the following simplifications can be used.
  (i) A number of HMVP candidates used for generating the merge candidate list can be set as (N<=4)? M: (8−N). N indicates a number of existing candidates in the merge candidate list and M indicates a number of available HMVP candidate(s) in the HMVP buffer. When the number of existing candidates (N) in the merge candidate list is less than or equal to 4, the number of HMVP candidates used for generating the merge candidate list equals to M. Otherwise, the number of HMVP candidates used for generating the merge candidate list equals to (8−N).
  (ii) When the total number of available merge candidates reaches the maximum allowed merge candidates minus 1, the merge candidate list construction process from the HMVP buffer is terminated.

When the IBC mode operates as a separate mode from the inter prediction mode, a simplified BV derivation process for the IBC mode can be used. A history-based block vector prediction buffer (referred as a HBVP buffer) can be used to perform BV prediction. The HBVP buffer can be used for storing BV information (e.g., BVs) of previously coded blocks of a current block (e.g., a CB or a CU) in a current picture. In an example, the HBVP buffer is a separate history buffer from other buffer(s), such as a HMVP buffer. The HBVP buffer can be a table.

The HBVP buffer can provide BV predictor (BVP) candidates (also referred to as HBVP candidates) for the current block. The HBVP buffer (e.g., the table) may include one or more HBVP candidates, and can be maintained during an encoding/a decoding process. In an example, a HBVP candidate in the HBVP buffer corresponds to the BV information of a previously coded block in the current picture. The HBVP buffer can be used in any suitable encoder and/or decoder. HBVP candidate(s) can be added to a merge candidate list configured for BV prediction after BV(s) of spatial neighboring block(s) of the current block. The merge candidate list configured for BV prediction can be used for the merge BV prediction mode and/or the non-merge BV prediction mode.

The HBVP buffer can be reset (e.g., emptied) when a new CTU (or a new CTB) row is encountered.

In an example, such as in VVC, a buffer size of the HBVP buffer is set to be 6, indicating that up to 6 HBVP candidates may be added to the HBVP buffer. In some embodiments, the HBVP buffer may operate in the FIFO rule, and thus, a piece of BV information (or a HBVP candidate) that is stored first in the HBVP buffer is the first to be removed from the HBVP buffer, for example, when the HBVP buffer is full. When inserting a new HBVP candidate into the HBVP buffer, a constrained FIFO rule can be utilized where a redundancy check is first applied to determine whether an identical or similar HBVP candidate is in the HBVP buffer. If an identical or similar HBVP candidate is determined to be in the HBVP buffer, the identical or similar HBVP candidate can be removed from the HBVP buffer and remaining HBVP candidates can be moved forward in the HBVP buffer.

The HBVP candidates can be used in a merge candidate list construction process, for example, in the merge BV prediction mode. The most recent stored HBVP candidate(s) in the HBVP buffer can be checked in an order and inserted into the merge candidate list after the spatial candidate(s). A redundancy check can be applied to the HBVP candidates with respect to the spatial merge candidates that are in the merge candidate list.

In an embodiment, a HBVP buffer is established to store one or more pieces of BV information of one or more previously coded blocks coded in the IBC mode. The one or more pieces of BV information can include one or more BVs of the one or more previously coded blocks coded in the IBC mode. Further, each of the one or more pieces of BV information can include side information (or additional information) such as a block size, a block location, and/or the like of the respective previously coded block coded in the IBC mode.

In class based history-based block vector prediction (also referred to as CBVP), for the current block, one or more pieces of BV information in the HBVP buffer that meet certain conditions can be classified into corresponding categories (also referred to as classes), and thus forming a CBVP buffer. In an example, each piece of BV information in the HBVP buffer is for a respective previously coded block, for example, coded with the IBC mode. The piece of BV information for the previously coded block can include a BV, a block size, a block position, and/or the like. The previously coded block has a block width, a block height, and a block area. The block area can be a multiplication of the block width and the block height. In an example, the block size is represented by the block area. The block position of the previously coded block can be represented by an upper left corner (e.g., an upper left corner of 4×4 area) or an upper left sample of the previously coded block.

Figure 13:
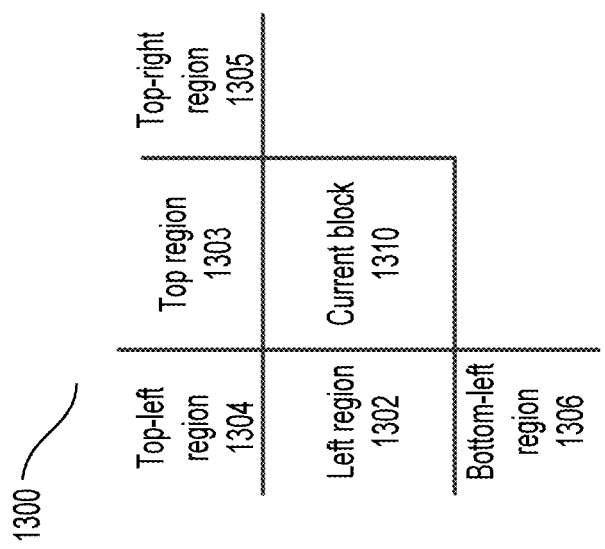
FIG. 13 shows an example of spatial classes for intra block copy block vector prediction for a current block according to an embodiment of the disclosure.

FIG. 13 shows an example of spatial classes for IBC BV prediction for a current block (e.g., a CB, a CU) (1310) according to an embodiment of the disclosure. A left region (1302) can be to the left of the current block (1310). BV information for previously coded block(s) having respective block position(s) in the left region (1302) can be referred to as left candidates or left BV candidates. A top region (1303) can be above the current block (1310). BV information for previously coded block(s) having respective block position(s) in the top region (1303) can be referred to as top candidates or top BV candidates. A top-left region (1304) can be to a top-left of the current block (1310). BV information for previously coded block(s) having respective block position(s) in the top-left region (1304) can be referred to as top-left candidates or top-left BV candidates. A top-right region (1305) can be to a top-right of the current block (1310). BV information for previously coded block(s) having respective block position(s) in the top-right region (1305) can be referred to as top-right candidates or top-right BV candidates. A bottom-left region (1306) can be to a bottom-left of the current block (1310). BV information for previously coded block(s) having respective block position(s) in the bottom-left region (1306) can be referred to as bottom-left candidates or bottom-left BV candidates. Other kinds of spatial classes can also be defined and used in the CBVP buffer.

If the BV information for the previously coded block meets the following conditions, the BV information can be classified into the corresponding categories (or classes).

(i) Class 0: the block size (e.g., the block area) is greater than or equal to a threshold (e.g., 64 pixels).

(ii) Class 1: an occurrence (or a frequency) of the BV is greater than or equal to 2. The occurrence of the BV can refer to a number of times the BV is used to predict previously coded block(s). When a pruning process is used to form the CBVP buffer, the BV can be stored in one entry (instead of in multiples entries having the same BV) when the BV is used multiple times in predicting previously coded blocks. The occurrence of the BV can be recorded.

(iii) Class 2: the block position is in the left region (1302) where a portion (e.g., an upper left corner of 4×4 area) of the previously coded block is to the left of the current block (1310). The previously coded block can be within the left region (1302). Alternatively, the previously coded block can span across multiple regions including the left region (1302) where the block position is in the left region (1302).

(iv) Class 3: the block position is in the top region (1303) where a portion (e.g., the upper left corner of 4×4 area) of the previously coded block is above the current block (1310). The previously coded block can be within the top region (1303). Alternatively, the previously coded block can span across multiple regions including the top region (1303) where the block position is in the top region (1303).

(v) Class 4: the block position is in the top-left region (1304) where a portion (e.g., the upper left corner of 4×4 area) of the previously coded block is at the top-left side of the current block (1310). The previously coded block can be within the top-left region (1304). Alternatively, the previously coded block can span across multiple regions including the top-left region (1304) where the block position is in the top-left region (1304).

(vi) Class 5: the block position is in the top-right region (1305) where a portion (e.g., the upper left corner of 4×4 area) of the previously coded block is at the top-right side of the current block (1310). The previously coded block can be within the top-right region (1305). Alternatively, the previously coded block can span across multiple regions including the top-right region (1305) where the block position is in the top-right region (1305).

(vii) Class 6: the block position is in the bottom-left region (1306) where a portion (e.g., the upper left corner of 4×4 area) of the coded block is at the bottom-left side of the current block (1310). The previously coded block can be within the bottom-left region (1306). Alternatively, the previously coded block can span across multiple regions including the bottom-left region (1306) where the block position is in the bottom-left region (1306).

For each category (or class), the BV of the most recently coded block can be derived as the BVP candidate. The CBVP buffer can be constructed by appending the BV predictor(s) of each category in an order from Class 0 to Class 6. The above description for the CBVP can be suitably adapted to include less classes or additional classes not described above. One or more of the Classes 0-6 can be modified. In an example, each entry in the HBVP buffer is classified into one of the seven Classes 0-6. An index can be signaled to indicate which of the Classes 0-6 is chosen. At a decoder side, the first entry in the chosen class can be used to predict a BV for the current block.

Aspects of the disclosure provide techniques for reference location constraints in string copying mode. String copying mode is also referred to as string matching (mode) or string prediction (mode). String matching mode is similar to intra block copy (IBC), and can reconstruct a string of samples based reconstructed area within the same picture. Further, the string matching mode provides more flexibility regarding the shape of the string of samples. For example, a block has a rectangular shape and a string can form a non rectangular shape.

Figure 14:
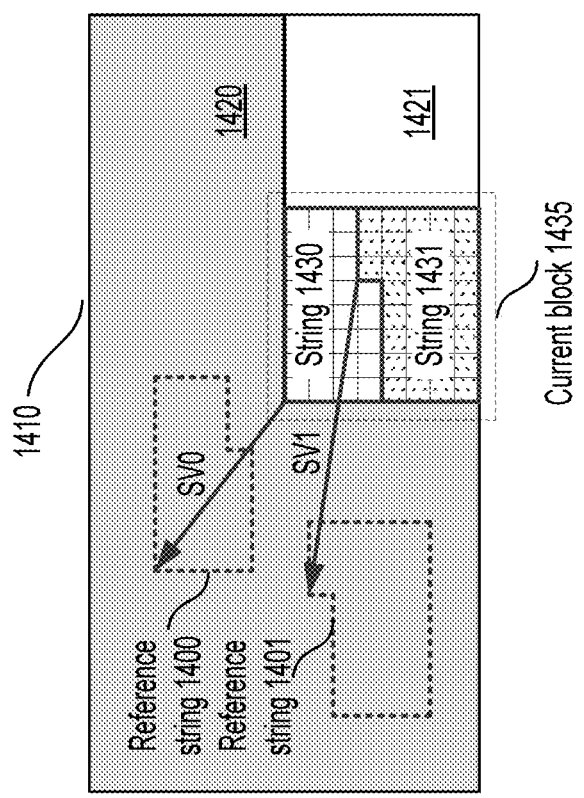
FIG. 14 shows an example of a string copy mode according to an embodiment of the disclosure.

FIG. 14 shows an example of a string copy mode according to an embodiment of the disclosure. A current picture (1410) includes a reconstructed region (a grey area) (1420) and a region (1421) that is under reconstruction. A current block (1435) in the region (1421) is under reconstruction. The current block (1435) can be a CB, a CU, or the like. The current block (1435) can include a plurality of strings, such as a string (1430) and a string (1431) in FIG. 14 example. In an example, the current block (1435) is divided into a plurality of continuous strings where one string is followed by a next string along a scan order. The scan order can be any suitable scan order, such as a raster scan order, a traverse scan order, or the like.

The reconstructed region (1420) can be used as a reference area to reconstruct the strings (1430) and (1431).

For each of the plurality of strings, a string offset vector (also referred to as string vector (SV)) and a length of the string (referred to as a string length) can be signaled. The SV can be a displacement vector that indicates a displacement offset between the string to be reconstructed and a reference string that is located in the reference area (1420) and has been reconstructed. The reference string can be used to reconstruct the string to be reconstructed. For example, SV0 is a displacement vector that indicates a displacement offset between the string (1430) and a reference string (1400), and SV1 is displacement vector that indicates a displacement offset between the string (1431) and a reference string (1401). Thus, the SV can indicate where the corresponding reference string is located in the reference area (1420). The string length for a string indicates a number of samples in the string. Generally, the string to be reconstructed has a same length as the reference string.

Referring to FIG. 14, the current block (1435) is an 8×8 CB including 64 samples. The current block (1435) is divided into the string (1430) and the string (1431) using the raster scan order. The string (1430) includes first 29 samples of the current block (1435), and the string (1431) includes remaining 35 samples of the current block (1435). The reference string (1400) used to reconstruct the string (1430) can be indicated by a corresponding string offset vector SV0, and a reference string (1401) used to reconstruct the string (1431) can be indicated by a corresponding string offset vector SV1.

In general, a string size can refer to a length of a string or a number of samples in a string. Referring to FIG. 14, the string (1430) includes 29 samples, and thus a string size of the string (1430) is 29. The string (1431) includes 35 samples, and thus a string size of the string (1431) is 35. A string location (or a string position) can be represented by a sample position of a sample (e.g., a first sample in a decoding order) in the string.

The above descriptions can be suitably adapted to reconstruct a current block that includes any suitable number of strings. Alternatively, in an example, when a sample in a current block does not have a matching sample in a reference area, an escape sample is signaled, and a value of the escape sample can be coded directly without referring to a reconstructed sample in the reference area.

In some examples, the available reference samples used in the string matching can be aligned with the reference area for IBC mode. Further, the reference sample availability logic that can be applied to in a combination of the reconstructed portion of current CTU and some area of the left CTU in the IBC mode can be similarly applied to the string matching as well.

In some examples, a reference memory is used to store recently reconstructed samples, and the reference memory can be accessed to reconstruct a current block in IBC mode or a current string in the string matching mode. Then, the string vector can be constrained based on the reference memory to make sure reference samples for reconstruction of the current block or current string are stored in the reference memory. In an example, the size of the reference memory size is assumed to be the same as a CTU size (128×128 samples for example). In some examples, the reference memory is implemented with fast access speed.

Figure 15:
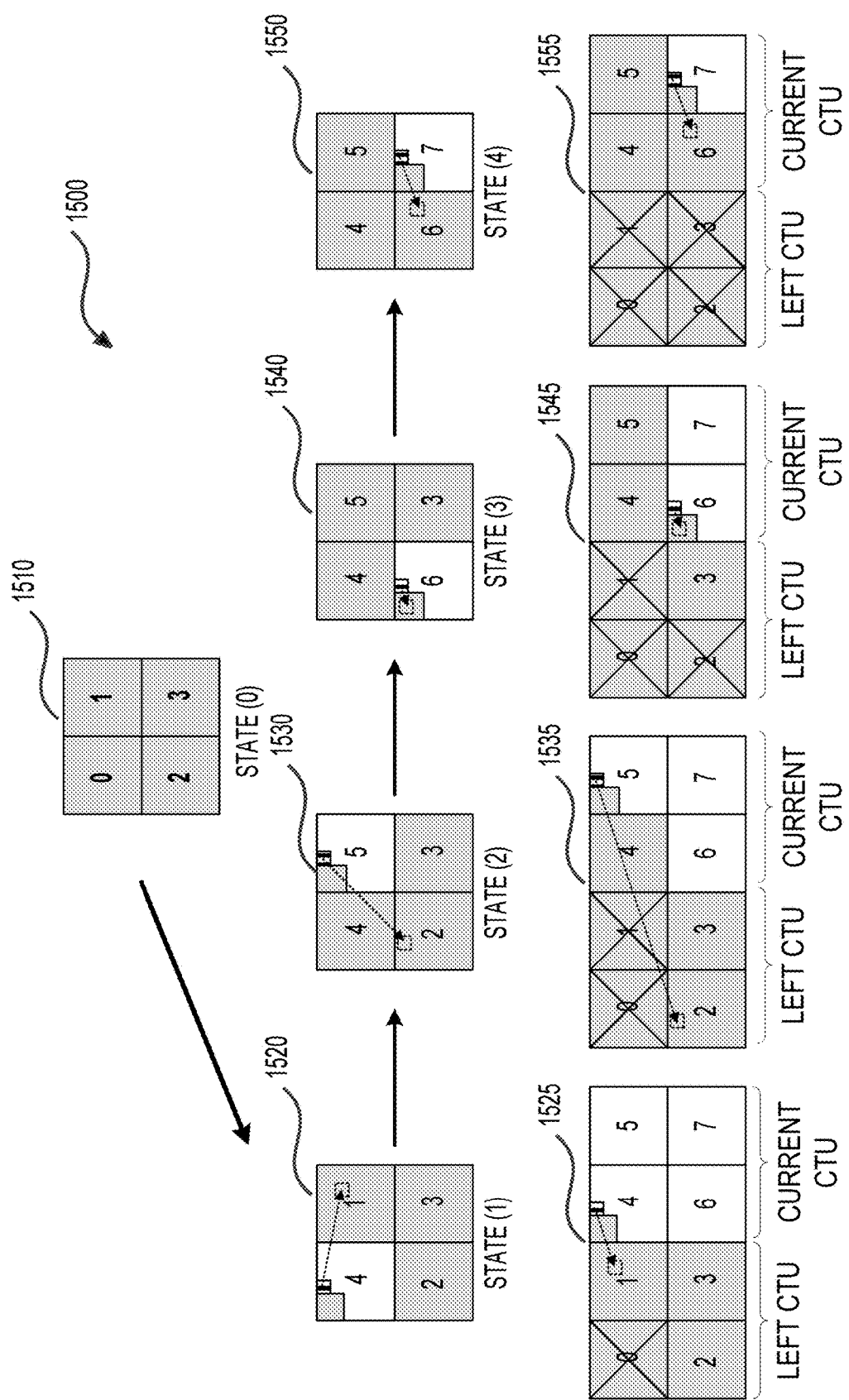
FIG. 15 shows a diagram of a picture during a coding process according to some embodiments of the disclosure.

FIG. 15 shows a process of the reference memory update for IBC mode in some examples, and the reference memory update process can be similarly used for the string matching mode.

In the FIG. 15 example, each CTU has a size of 128×128 samples, thus the reference memory has a size for storing 128×128 samples. In FIG. 15, the reference memory is divided into 4 sub portions that each has a size of 64×64 samples. During operation of coding a current CTU, the reference memory is updated one sub portion by one sub portion in some examples. FIG. 15 shows states of the reference memory (reference memory view) during the coding of the current CTU, and corresponding encoding/decoding process based on CTUs (CTU view). In FIG. 15, the coded portion is shown by grey color and uncoded portion is shown by white color, the current coding block is shown by stripe pattern, and a reference block for the current coding block is shown by dashed line.

For example, initially the reference memory is in state (0) as shown by (1510), and stores reconstructed samples in the left CTU of the current CTU. For example, the left CTU can be divided into 4 sub blocks that are labeled as 0, 1, 2, and 3, and the reference memory stores the reconstructed samples of the sub blocks 0-3 of the left CTU as shown by (1510). The current CTU can be divided into 4 sub blocks that are labeled as 4, 5, 6, and 7.

To encode/decode the sub block 4 in the current CTU, the reference memory enters state (1) as shown by (1520). The reference memory can still store the reconstructed samples of sub blocks 1, 2 and 3 of the left CTU. The sub portion of the reference memory that was used to store the reconstructed samples of the sub block 0 of the left CTU will be used to store the reconstructed samples of the sub block 4 of the current CTU. In an example, before coding the sub block 4 of the current CTU, the sub portion of the reference memory that was used to store the reconstructed samples of the sub block 0 can be cleared.

From CTU view, as shown by (1525), the sub block 0 of the left CTU is not available in the reference memory, and is marked with "X". The sub blocks 1-3 in the left CTU are still in the reference memory.

To encode/decode the sub block 5 in the current CTU, the reference memory enters state (2) as shown by (1530). The reference memory can still store the reconstructed samples of sub blocks 2 and 3 of the left CTU, and sub block 4 of the current CTU. The sub portion of the reference memory that was used to store the reconstructed samples of the sub block 1 of the left CTU will be used to store the reconstructed samples of the sub block 5 of the current CTU.

From CTU view, as shown by (1535), the sub blocks 0 and 1 of the left CTU are not available in the reference memory, and are marked with "X". The sub blocks 2 and 3 in the left CTU are still in the reference memory.

To encode/decode the sub block 6 in the current CTU, the reference memory enters state (3) as shown by (1540). The reference memory can still store the reconstructed samples of sub block 3 of the left CTU, and sub blocks 4 and 5 of the current CTU. The sub portion of the reference memory that was used to store the reconstructed samples of the sub block 2 of the left CTU will be used to store the reconstructed samples of the sub block 6 of the current CTU.

From CTU view, as shown by (1545), the sub blocks 0, 1 and 2 of the left CTU are not available in the reference memory, and are marked with "X". The sub block 3 in the left CTU is still in the reference memory.

To encode/decode the sub block 7 in the current CTU, the reference memory enters state (4) as shown by (1550). The reference memory can still store the reconstructed samples of sub blocks 4, 5 and 6 of the current CTU. The sub portion of the reference memory that was used to store the reconstructed samples of the sub block 3 of the left CTU will be used to store the reconstructed samples of the sub block 7 of the current CTU.

From CTU view, as shown by (1555), the sub blocks 0, 1, 2 and 3 of the left CTU are not available in the reference memory, and are marked with "X".

In the FIG. 15 example, in each state (at the beginning of coding each 64×64 sub block of current CTU), the available reference area with corresponding samples available in the reference memory is shown in grey color without "X" mark.

According to some aspects of the disclosure, reference sample constraints can be loosened for the string matching mode, thus more potential reference samples are available for use, and coding efficiency may be improved.

In an example, the IBC mode has a non-overlapping constraint that requires no overlapping of the reference block with the current block. The non-overlapping constraint can be similarly applied in the string matching mode. For example, the non-overlapping constraint in the string matching mode requires that samples of the reference string should not overlap with samples in the current string. The non-overlapping constraint is used to avoid accessing not-yet-reconstructed samples in the reference string when performing copying reference samples to fill current string. In a related example, the reconstruction of the current string can be performed by a memory copy operation that copies values stored in a first memory space corresponding to the reference string to a second memory space corresponding to the current string. To perform the memory copy operation, samples of the reference string need to be reconstructed and stored in the first memory space, thus the current string is required to be non overlapping to the reference string. The non-overlapping constraint can restrict string vectors and limit coding efficiency.

In the following, the term block may be interpreted as a prediction block, a coding block, or a coding unit, i.e. CU.

Some aspects of the disclosure provide techniques to allow string matching mode with overlapped samples between a current string and a reference string. The string vector for the current string is denoted by SV(svx, svy), where svx is the horizontal component and svy is the vertical component. In some examples, the top left corner of a picture is considered as an origin for the two dimensional plane of the picture, and horizontal values (e.g., x values) of the two dimensional plane increase in the direction of left to right, and vertical values (e.g., y values) of the two dimensional plane increases in the direction of top to bottom.

According to some aspects of the disclosure, samples in the current string can be reconstructed by portions, such as in a portion by portion process. In the portion by portion process, a first portion of the current string is reconstructed before a reconstruction of a second portion of the current string. After the reconstruction of the first portion of the current string, the second portion of the current string can be reconstructed based on the first portion of the current string. In some examples, the reconstruction of the current string can be performed by multiple memory copy operations. For example, the reconstruction of the first portion of the current string is performed by a first memory copy operation that stores sample values in a first memory space corresponding to the first portion of the current string, and the reconstruction of the second portion of the current string is performed by a second memory copy operation that stores sample values in a second memory space corresponding to the second portion of the current string. The second memory copy operation copies at least a sample value in the first memory space to store in the second memory space.

It is noted that, in the above description, portions of the current string can respectively have any suitable number of samples, and can have any suitable shape. In an example, a portion of a string is a sample row that includes a row of samples in the string. In another example, a portion of a string is a sample column that includes a column of samples in the string. In another example, a portion of a string is a sample in the string.

For ease of description, horizontal scan order is assumed for the following description of techniques of reference location constraints in the string matching mode. The corresponding techniques of reference location constraints in the string matching mode with vertical scan order can be suitably derived in a similar manner.

According to an aspect of the disclosure, when a current string includes multiple lines (e.g., sample rows in horizontal direction, sample columns in vertical direction), the reconstruction of the current string can be performed in a line-by-line manner (e.g., row-by-row manner, column-by-column manner).

In an example, a current string includes multiple sample rows that each can be scanned in the horizontal scan order, the reconstruction of the current string can be performed in a row-by-row manner. Specifically, a reconstruction of samples in a row of the current string can be performed when samples in a previous row (following the scan order) of the current string has been reconstructed.

Figure 16:
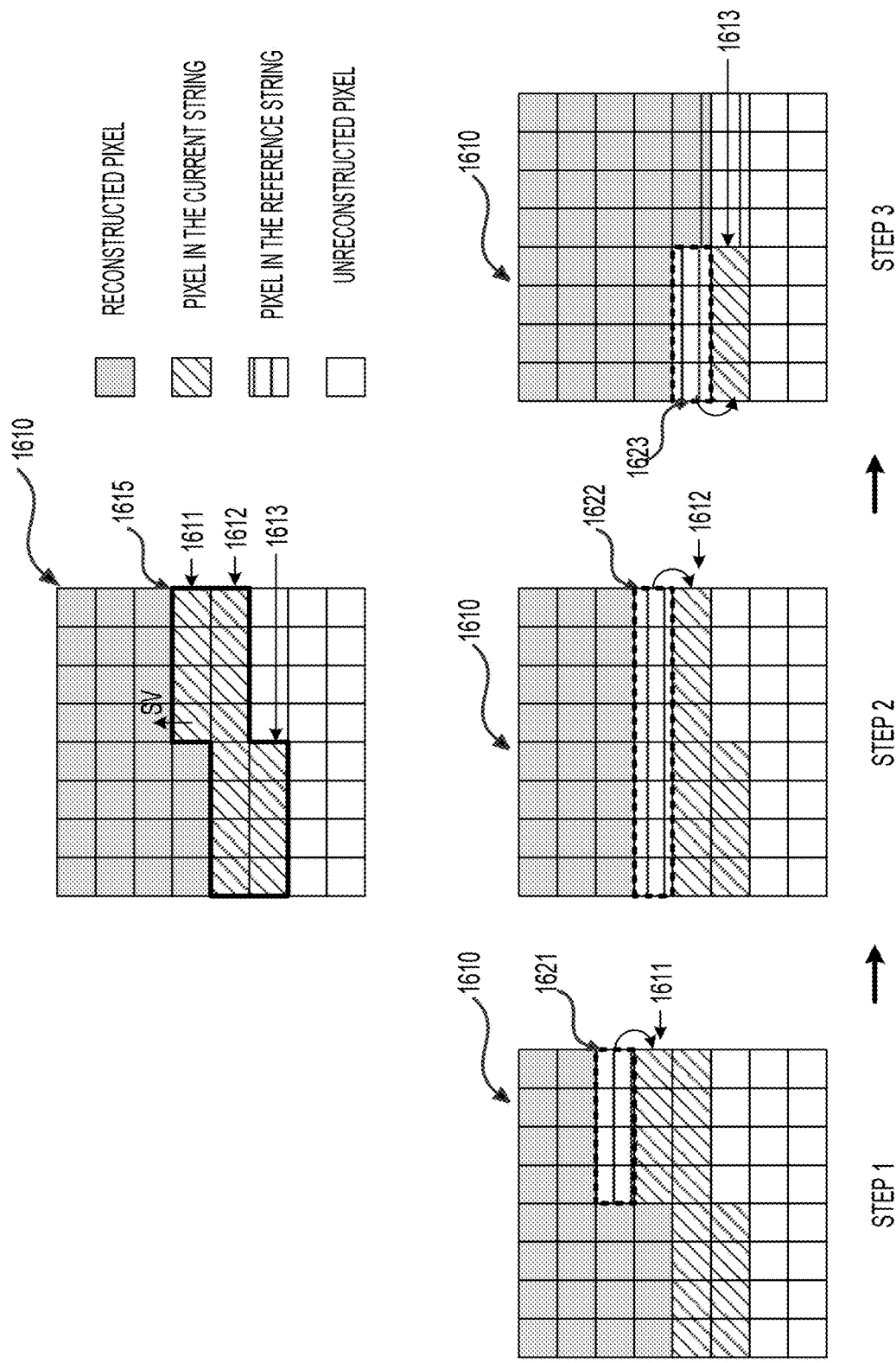
FIG. 16 shows an example of reconstructing process of a string according to some examples.

FIG. 16 shows an example of a reconstructing process of a string according to some examples. FIG. 16 shows a reconstruction process of a current string (1615) in a block (1610). A string vector SV is determined for the current string (1615). The string vector SV points to a reference string that overlaps with the current string (1615). In the FIG. 16 example, the current string (1615) includes samples in three rows, such as a first sample row (1611), a second sample row (1612) and a third sample row (1613) that can be scanned according to the horizontal scan order.

The current string (1615) is reconstructed in a row-by-row manner. For example, in a first step (STEP 1), the first sample row (1611) of the current string (1615) is reconstructed based on pixels (1621) of the reference string. In an example, a memory copy operation can be performed to copy samples values stored in a memory space corresponding to the pixels (1621) to a memory space corresponding to the first sample row (1611).

Further, in a second step (STEP 2), the second sample row (1612) of the current string (1615) is reconstructed based on pixels (1622) of the reference string. In an example, a memory copy operation can be performed to copy samples values stored in a memory space corresponding to the pixels (1622) to a memory space corresponding to the second sample row (1612).

Further, in a third step (STEP 3), the third sample row (1613) of the current string (1615) is reconstructed based on pixels (1623) of the reference string. In an example, a memory copy operation can be performed to copy samples values stored in a memory space corresponding to the pixels (1623) to a memory space corresponding to the third sample row (1613).

According to an aspect of the disclosure, the non overlapping constraints can be loosened without enforcement. In some examples, when at least one of a vertical component and a horizontal component of the string vector being negative, the string vector satisfies the requirement for the allowance of the partial overlapping of the current string and the reference string, and the non overlapping constraints are not enforced.

In an example of using the horizontal scan order, when the vertical component svy of the string vector SV is negative (svy<0), the reference string is above the current string. Then, regardless the value of horizontal component svx of the string vector SV, the overlapping between a current string and the reference string is allowed, thus the overlapping constraint is not enforced.

However, when the vertical component svy of the string vector SV is not negative (svy>=0), the reference string is in the same row as the current string or below the current string. Then, regardless the value of horizontal component svx, the overlapping constraint needs to be enforced, so that, no overlapping between a current string and its reference string is allowed.

It is noted that, in the above examples, the entire reference string should be inside the allowable reference area.

Generally, the reference memory is formed by multiple portions, such as multiple pages, and the like. In some examples, access to memory space in a same portion (e.g., a same page) can be performed with ease, such as without calculating a large offset value. In some examples, samples of the reference string are constrained in a region corresponding to a page of memory space.

According to an aspect of the disclosure, the samples of the reference string are allowed to cross boundary of two regions corresponding to two pages of memory space.

Figure 17:
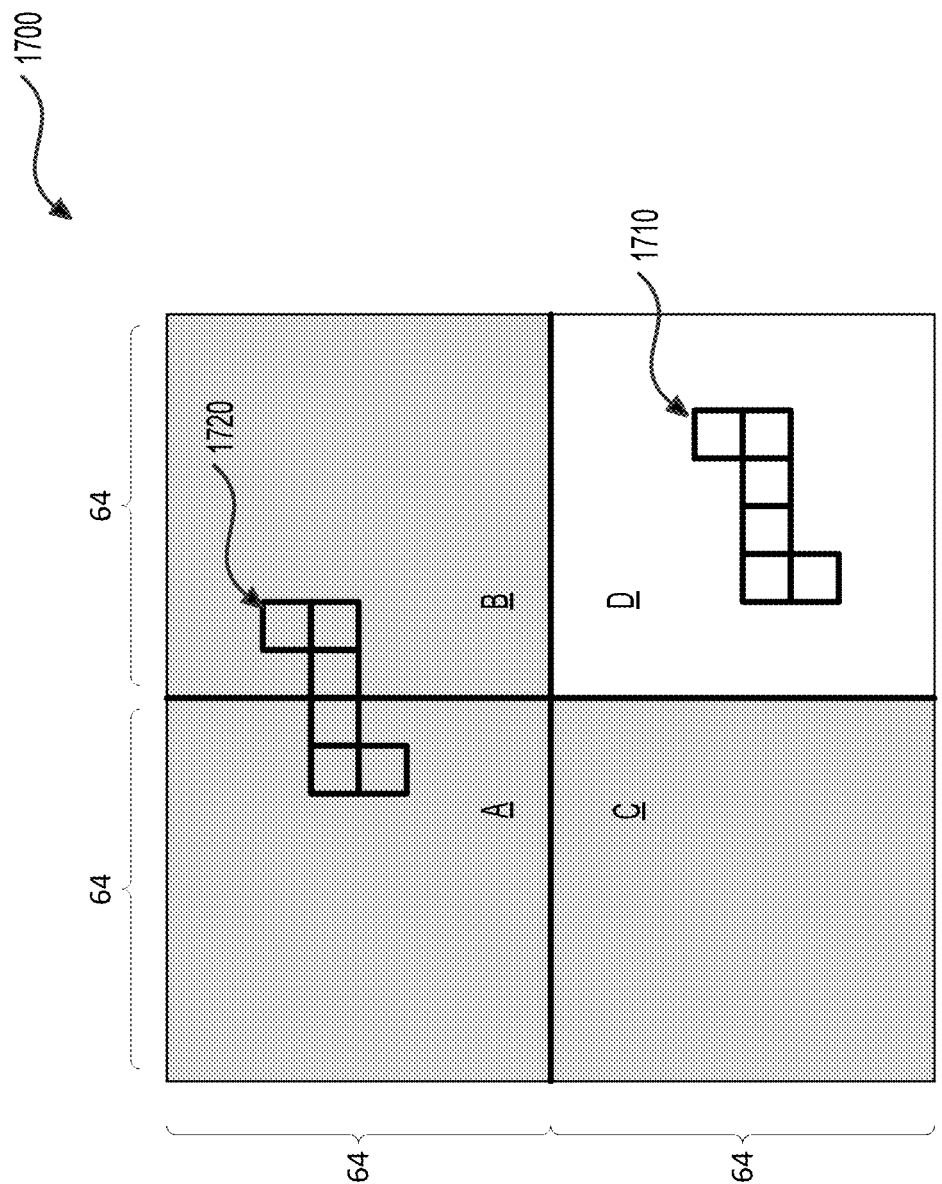
FIG. 17 shows an example of a reference string that crosses a region boundary.

FIG. 17 shows an example of a reference string that crosses a region boundary. In the FIG. 17 example, a block (1700) can be a 128×128 (samples) block, such as a CTU. The block (1700) is divided into four 64×64 sub blocks A-D. The sub blocks A, B and C have been reconstructed, and a current string for reconstruction is in the sub block D. In the FIG. 17 example, the current string (1710) to be reconstructed is in the sub block D, and the reference string (1720) crosses the boundary of the sub block A and the sub block C.

Figure 18:
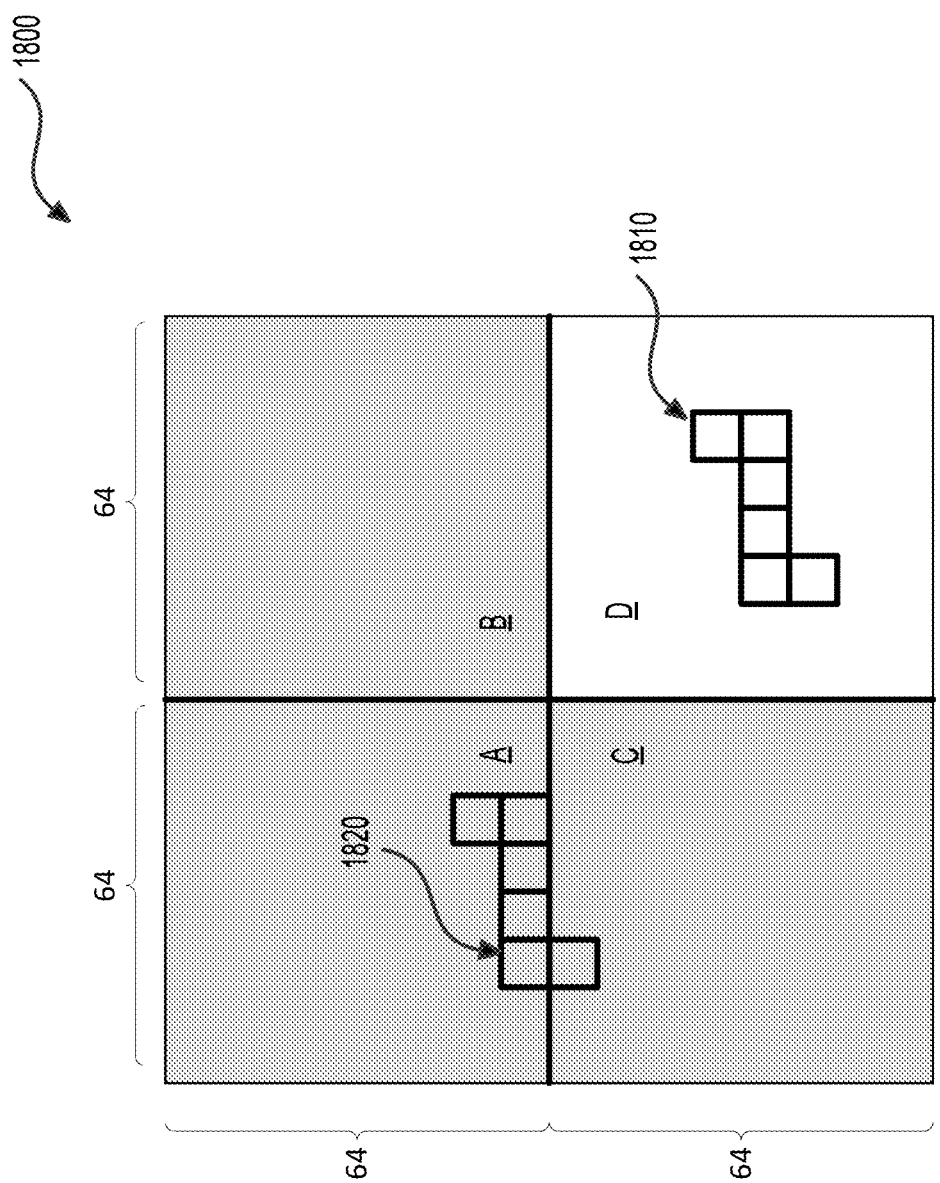
FIG. 18 shows another example of a reference string that crosses a region boundary.

FIG. 18 shows another example of a reference string that crosses a region boundary. In the FIG. 18 example, a block (1800) can be a 128×128 (samples) block, such as a CTU. The block (1800) is divided into four 64×64 sub blocks A-D. The sub blocks A, B and C are reconstructed, and a current string for reconstruction is in the sub block D. In the FIG. 18 example, the current string (1810) to be reconstructed is in the sub block D, and the reference string (1820) crosses the boundary of the sub block A and the sub block C.

In some examples, for memory reuse, the reference memory is divided into multiple regions of the same size. The multiple regions can be allocated to store samples of the sub blocks. For example, at a time to reconstruct the sub block D, a first region of reference memory can store the reconstructed samples of the sub block A; a second region of the reference memory can store the reconstructed samples of the sub block B; a third region of the reference memory can store the reconstructed samples of the sub block C; and a fourth region of the reference memory can be allocated to store the to-be reconstructed samples of the sub block D.

In some embodiments, cross boundary constraints can be used. In an embodiment, while the entire reference string is inside the allowable reference area, a vertical cross boundary constraint is applied. The vertical cross boundary constraint does not allow the reference string of the current string to cross the boundary of two sub blocks vertically but can allow the reference string to cross the boundary of two sub blocks horizontally. For example, the reference string (1720) is allowed and the reference string (1820) is not allowed. In an example, the starting position of the reference string is (px0, py0). For any sample (pxi, pyi) in the reference string, the vertical cross boundary constraint requires (floor(py0/64)) to be equal to (floor(pyi/64)).

In another embodiment, while the entire reference string is inside the allowable reference area, a horizontal cross boundary constraint is applied. The horizontal cross boundary constraint does not allow the reference string of the current string to cross the boundary of two sub blocks horizontally but can allow the reference string to cross the boundary of two sub blocks vertically. For example, the reference string (1820) is allowed and the reference string (1720) is not allowed. In an example, the starting position of the reference string be (px0, py0), for any sample (pxi, pyi) of the reference string, the horizontal cross boundary constraint requires (floor(px0/64)) to be equal to (floor(pxi/64)).

According to an aspect of the disclosure, the constraint that limits the reference string to be in the current CTU can be loosened. For example, a sample row above the current CTU can also be used as reference samples in a reference string.

Figure 19:
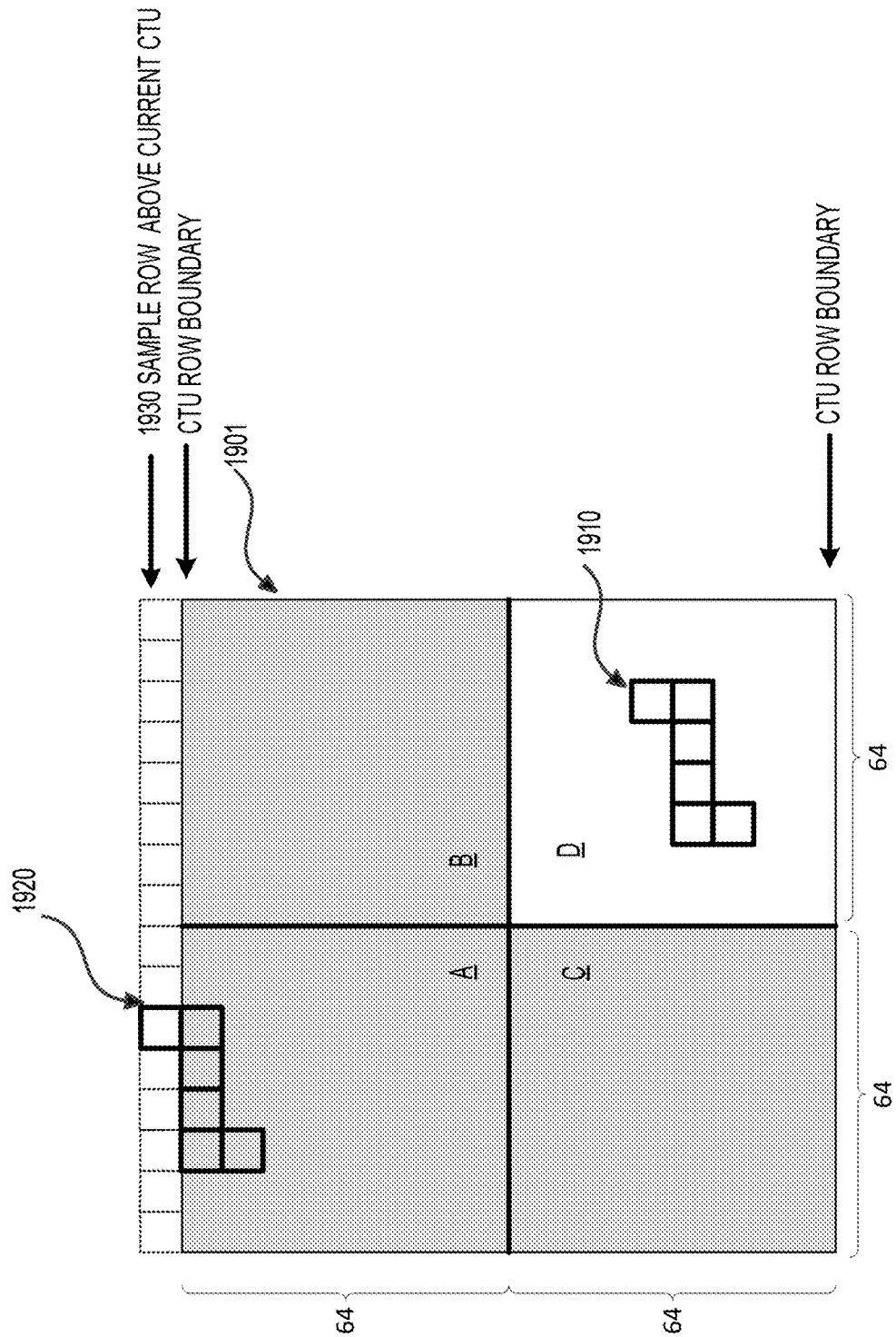
FIG. 19 shows an example of a reference string with samples above the current CTU.

FIG. 19 shows an example of a reference string with samples above the current CTU. In the FIG. 19 example, a current CTU (1901) is a 128×128 (samples) block. The current CTU (1901) is divided into four 64×64 sub blocks A-D. The sub blocks A, B and C are reconstructed, and a current string for reconstruction is in the sub block D. In the FIG. 19 example, the current string (1910) to be reconstructed is in the sub block D, and the reference string (1920) has at least one sample in a sample row (1930) above the current CTU (1901). The overlapping between the reference string (1920) and the sample row (1930) above the current CTU (1901) is allowed. In an example, a decoder includes a specific buffer (referred to as a line buffer in an example) to store samples in a sample row, such as the sample row (1930) above the current CTU (1901), and the specific buffer can be accessed during the string matching mode. Thus, when the reference string (1920) includes samples that overlap with the sample row (1930), the specific buffer can be accessed to copy the overlapped samples to reconstruct the current string (1910).

Figure 20:
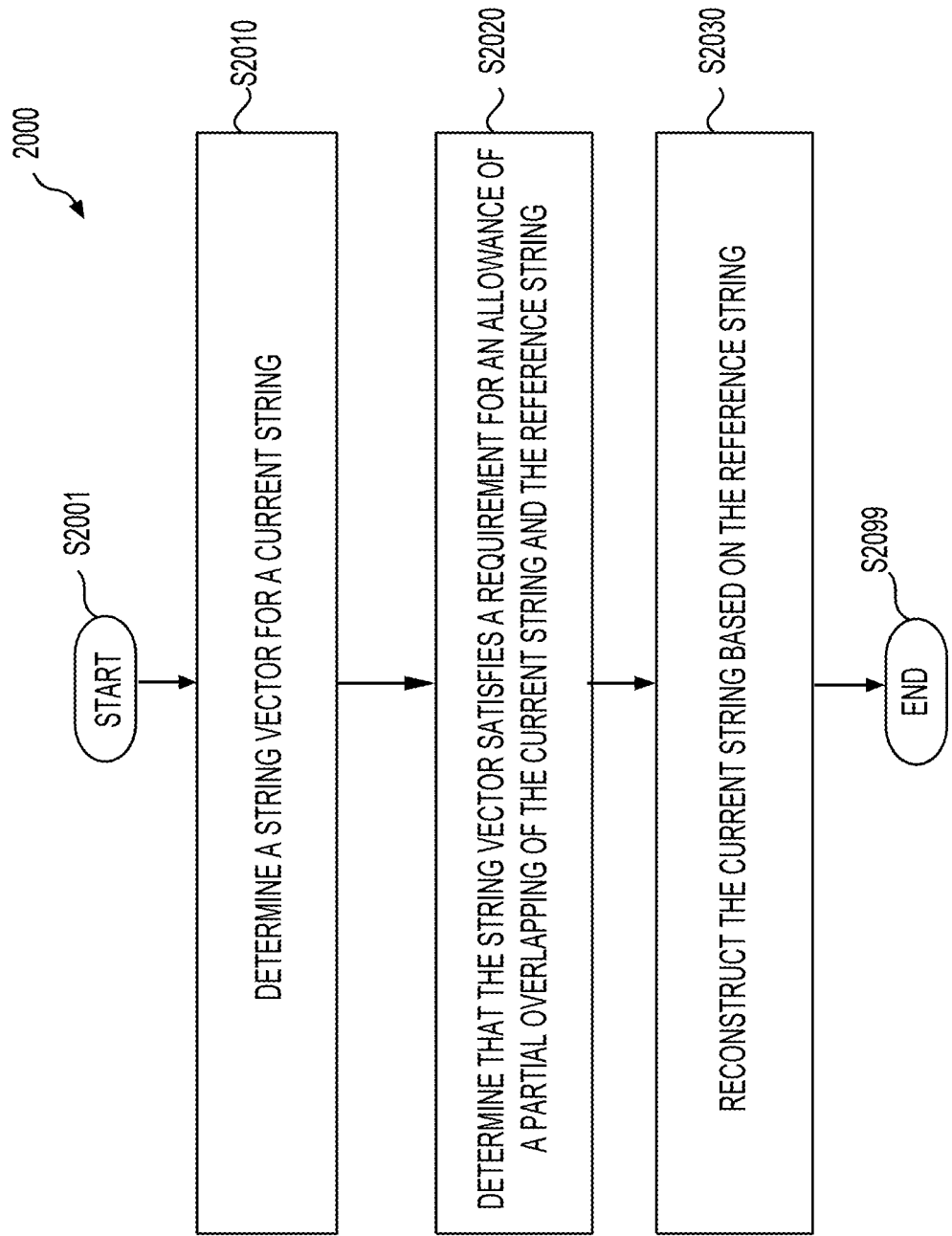
FIG. 20 shows a flow chart outlining a process according to an embodiment of the disclosure.

FIG. 20 shows a flow chart outlining a process (2000) according to an embodiment of the disclosure. The process (2000) can be used to reconstruct a block or a string in a picture of a coded video sequence. The process (2000) can be used in the reconstruction of the block to generate a prediction block for the block under reconstruction. The term block in the disclosure may be interpreted as a prediction block, a CB, a CU, or the like. In various embodiments, the process (2000) are executed by processing circuitry, such as the processing circuitry in the terminal devices (310), (320), (330) and (340), the processing circuitry that performs functions of the video encoder (403), the processing circuitry that performs functions of the video decoder (410), the processing circuitry that performs functions of the video decoder (510), the processing circuitry that performs functions of the video encoder (603), and the like. In some embodiments, the process (2000) is implemented in software instructions, thus when the processing circuitry executes the software instructions, the processing circuitry performs the process (2000). The process starts at (S2001) and proceeds to (S2010).

At (S2010), a (potential) string vector for a current string in a CTU is determined. The (potential) string vector points to a reference string for the current string.

At (S2020), the (potential) string vector is determined to satisfy a requirement for an allowance of a partial overlapping of the current string and the reference string.

In some examples, in response to at least one of a vertical component and a horizontal component of the (potential) string vector being negative, the (potential) string vector is determined to satisfy the requirement for the allowance of the partial overlapping of the current string and the reference string.

In an example, overlapping constraints can be skipped in response to a satisfaction of the requirement for the allowance of the partial overlapping of the current string and the reference string. In another example, the overlapping constraints are applied on the (potential) string vector in response to a failure to satisfy the requirement for the allowance of the partial overlapping of the current string and the reference string.

At (S2030), the current string is reconstructed based on the reference string.

In some examples, the current string is reconstructed by portions. For example, a first portion of the current string is reconstructed before a reconstruction of a second portion of the current string. Then, the second portion of the current string can be reconstructed based on the first portion of the current string.

In an example, a horizontal scan order for strings is used. Then, in response to a vertical component of the string vector being negative, the current string is reconstructed in a row by row manner. For example, a first sample row of the current string is reconstructed and then a second sample row of the current string is reconstructed based on the first sample row of the current string.

In another example, a vertical scan order for strings is used. Then, in response to a horizontal component of the string vector being negative, the current string is reconstructed in a column by column manner. For example, a first sample column of the current string is reconstructed and a second sample column of the current string is reconstructed based on the first sample column of the current string.

In some embodiments, the reference string overlaps with a sample row above the current CTU, then a buffer storing samples in the sample row can be accessed for a reconstruction of the current string.

Then, the process proceeds to (S2099) and terminates.

The process (2000) can be suitably adapted. Step(s) in the process (2000) can be modified and/or omitted. Additional step(s) can be added. Any suitable order of implementation can be used. For example, when the current vector information is determined to be unique, as described above, the current vector information can be stored into the history buffer. In some examples, a pruning process is used and one of the vector information in the history buffer is removed when the current vector information is stored into the history buffer.

The techniques described above, can be implemented as computer software using computer-readable instructions and physically stored in one or more computer-readable media. For example, FIG. 21 shows a computer system (2100) suitable for implementing certain embodiments of the disclosed subject matter.

The computer software can be coded using any suitable machine code or computer language, that may be subject to assembly, compilation, linking, or like mechanisms to create code comprising instructions that can be executed directly, or through interpretation, micro-code execution, and the like, by one or more computer central processing units (CPUs), Graphics Processing Units (GPUs), and the like.

The instructions can be executed on various types of computers or components thereof, including, for example, personal computers, tablet computers, servers, smartphones, gaming devices, internet of things devices, and the like.

Figure 21:
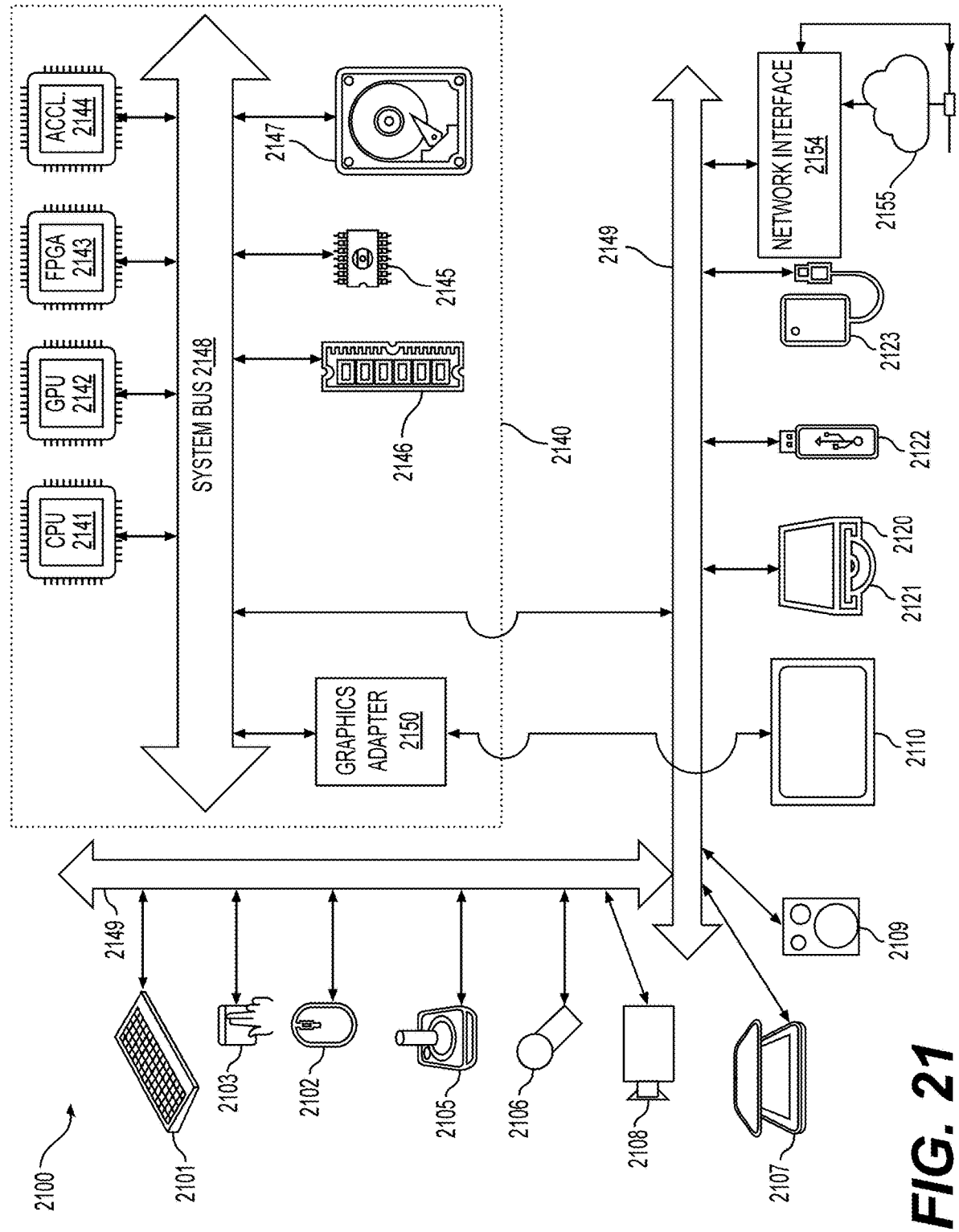
FIG. 21 is a schematic illustration of a computer system in accordance with an embodiment.

The components shown in FIG. 21 for computer system (2100) are exemplary in nature and are not intended to suggest any limitation as to the scope of use or functionality of the computer software implementing embodiments of the present disclosure. Neither should the configuration of components be interpreted as having any dependency or requirement relating to any one or combination of components illustrated in the exemplary embodiment of a computer system (2100).

Computer system (2100) may include certain human interface input devices. Such a human interface input device may be responsive to input by one or more human users through, for example, tactile input (such as: keystrokes, swipes, data glove movements), audio input (such as: voice, clapping), visual input (such as: gestures), olfactory input (not depicted). The human interface devices can also be used to capture certain media not necessarily directly related to conscious input by a human, such as audio (such as: speech, music, ambient sound), images (such as: scanned images, photographic images obtain from a still image camera), video (such as two-dimensional video, three-dimensional video including stereoscopic video).

Input human interface devices may include one or more of (only one of each depicted): keyboard (2101), mouse (2102), trackpad (2103), touch screen (2110), data-glove (not shown), joystick (2105), microphone (2106), scanner (2107), camera (2108).

Computer system (2100) may also include certain human interface output devices. Such human interface output devices may be stimulating the senses of one or more human users through, for example, tactile output, sound, light, and smell/taste. Such human interface output devices may include tactile output devices (for example tactile feedback by the touch-screen (2110), data-glove (not shown), or joystick (2105), but there can also be tactile feedback devices that do not serve as input devices), audio output devices (such as: speakers (2109), headphones (not depicted)), visual output devices (such as screens (2110) to include CRT screens, LCD screens, plasma screens, OLED screens, each with or without touch-screen input capability, each with or without tactile feedback capability—some of which may be capable to output two dimensional visual output or more than three dimensional output through means such as stereographic output; virtual-reality glasses (not depicted), holographic displays and smoke tanks (not depicted)), and printers (not depicted).

Computer system (2100) can also include human accessible storage devices and their associated media such as optical media including CD/DVD ROM/RW (2120) with CD/DVD or the like media (2121), thumb-drive (2122), removable hard drive or solid state drive (2123), legacy magnetic media such as tape and floppy disc (not depicted), specialized ROM/ASIC/PLD based devices such as security dongles (not depicted), and the like.

Those skilled in the art should also understand that term "computer readable media" as used in connection with the presently disclosed subject matter does not encompass transmission media, carrier waves, or other transitory signals.

Computer system (2100) can also include an interface (2154) to one or more communication networks (2155). Networks can for example be wireless, wireline, optical. Networks can further be local, wide-area, metropolitan, vehicular and industrial, real-time, delay-tolerant, and so on. Examples of networks include local area networks such as Ethernet, wireless LANs, cellular networks to include GSM, 3G, 4G, 5G, LTE and the like, TV wireline or wireless wide area digital networks to include cable TV, satellite TV, and terrestrial broadcast TV, vehicular and industrial to include CANBus, and so forth. Certain networks commonly require external network interface adapters that attached to certain general purpose data ports or peripheral buses (2149) (such as, for example USB ports of the computer system (2100)); others are commonly integrated into the core of the computer system (2100) by attachment to a system bus as described below (for example Ethernet interface into a PC computer system or cellular network interface into a smartphone computer system). Using any of these networks, computer system (2100) can communicate with other entities. Such communication can be uni-directional, receive only (for example, broadcast TV), uni-directional send-only (for example CANbus to certain CANbus devices), or bi-directional, for example to other computer systems using local or wide area digital networks. Certain protocols and protocol stacks can be used on each of those networks and network interfaces as described above.

Aforementioned human interface devices, human-accessible storage devices, and network interfaces can be attached to a core (2140) of the computer system (2100).

The core (2140) can include one or more Central Processing Units (CPU) (2141), Graphics Processing Units (GPU) (2142), specialized programmable processing units in the form of Field Programmable Gate Areas (FPGA) (2143), hardware accelerators for certain tasks (2144), graphics adapters (2150), and so forth. These devices, along with Read-only memory (ROM) (2145), Random-access memory (2146), internal mass storage such as internal non-user accessible hard drives, SSDs, and the like (2147), may be connected through a system bus (2148). In some computer systems, the system bus (2148) can be accessible in the form of one or more physical plugs to enable extensions by additional CPUs, GPU, and the like. The peripheral devices can be attached either directly to the core's system bus (2148), or through a peripheral bus (2149). In an example, the screen (2110) can be connected to the graphics adapter (2150). Architectures for a peripheral bus include PCI, USB, and the like.

CPUs (2141), GPUs (2142), FPGAs (2143), and accelerators (2144) can execute certain instructions that, in combination, can make up the aforementioned computer code.

That computer code can be stored in ROM (2145) or RAM (2146). Transitional data can be also be stored in RAM (2146), whereas permanent data can be stored for example, in the internal mass storage (2147). Fast storage and retrieve to any of the memory devices can be enabled through the use of cache memory, that can be closely associated with one or more CPU (2141), GPU (2142), mass storage (2147), ROM (2145), RAM (2146), and the like.

The computer readable media can have computer code thereon for performing various computer-implemented operations. The media and computer code can be those specially designed and constructed for the purposes of the present disclosure, or they can be of the kind well known and available to those having skill in the computer software arts.

As an example and not by way of limitation, the computer system having architecture (2100), and specifically the core (2140) can provide functionality as a result of processor(s) (including CPUs, GPUs, FPGA, accelerators, and the like) executing software embodied in one or more tangible, computer-readable media. Such computer-readable media can be media associated with user-accessible mass storage as introduced above, as well as certain storage of the core (2140) that are of non-transitory nature, such as core-internal mass storage (2147) or ROM (2145). The software implementing various embodiments of the present disclosure can be stored in such devices and executed by core (2140). A computer-readable medium can include one or more memory devices or chips, according to particular needs. The software can cause the core (2140) and specifically the processors therein (including CPU, GPU, FPGA, and the like) to execute particular processes or particular parts of particular processes described herein, including defining data structures stored in RAM (2146) and modifying such data structures according to the processes defined by the software. In addition or as an alternative, the computer system can provide functionality as a result of logic hard-wired or otherwise embodied in a circuit (for example: accelerator (2144)), which can operate in place of or together with software to execute particular processes or particular parts of particular processes described herein. Reference to software can encompass logic, and vice versa, where appropriate. Reference to a computer-readable media can encompass a circuit (such as an integrated circuit (IC)) storing software for execution, a circuit embodying logic for execution, or both, where appropriate. The present disclosure encompasses any suitable combination of hardware and software.

APPENDIX A: ACRONYMS

JEM: joint exploration model
VVC: versatile video coding
BMS: benchmark set
MV: Motion Vector
HEVC: High Efficiency Video Coding
MPM: most probable mode
WAIP: Wide-Angle Intra Prediction
SEI: Supplementary Enhancement Information
VUI: Video Usability Information
GOPs: Groups of Pictures
TUs: Transform Units,
PUs: Prediction Units
CTUs: Coding Tree Units
CTBs: Coding Tree Blocks
PBs: Prediction Blocks
HRD: Hypothetical Reference Decoder
SDR: standard dynamic range
SNR: Signal Noise Ratio
CPUs: Central Processing Units
GPUs: Graphics Processing Units
CRT: Cathode Ray Tube
LCD: Liquid-Crystal Display
OLED: Organic Light-Emitting Diode
CD: Compact Disc
DVD: Digital Video Disc
ROM: Read-Only Memory
RAM: Random Access Memory
ASIC: Application-Specific Integrated Circuit
PLD: Programmable Logic Device
LAN: Local Area Network
GSM: Global System for Mobile communications
LTE: Long-Term Evolution
CANBus: Controller Area Network Bus
USB: Universal Serial Bus
PCI: Peripheral Component Interconnect
FPGA: Field Programmable Gate Areas
SSD: solid-state drive
IC: Integrated Circuit
CU: Coding Unit
PDPC: Position Dependent Prediction Combination
ISP: Intra Sub-Partitions
SPS: Sequence Parameter Setting While this disclosure has described several exemplary embodiments, there are alterations, permutations, and various substitute equivalents, which fall within the scope of the disclosure. It will thus be appreciated that those skilled in the art will be able to devise numerous systems and methods which, although not explicitly shown or described herein, embody the principles of the disclosure and are thus within the spirit and scope thereof.

What is claimed is:

1. A method for video decoding in a decoder, comprising:
    determining, by a processor, a string vector for a current string in a first sub-block of a current coding tree unit (CTU), the string vector pointing to a reference string for the current string, the reference string being positioned across a boundary such that a first portion of the reference string is in a second sub-block and a second portion of the reference string is in a third sub-block of the CTU;
    determining whether a vertical cross boundary constraint or a horizontal cross boundary constraint are applied to the reference string;
    in response to a determination that (i) the vertical cross boundary constraint is applied and (ii) the boundary of the second sub-block and the third sub-block is a vertical boundary, determining, by the processor, that the reference string is not allowed; and
    in response to a determination that (i) the horizontal cross boundary constraint is applied and (ii) the boundary of the second sub-block and the third sub-block is a horizontal boundary, determining, by the processor, that the reference string is not allowed.

2. The method of claim 1, further comprising:
    reconstructing a first sample row of the current string before a reconstruction of a second sample row of the current string.

3. The method of claim 2, further comprising:
    reconstructing the second sample row of the current string based on the first sample row of the current string.

4. The method of claim 1, further comprising:
    determining that partial overlapping of the current string and the reference string is allowed in response to a vertical component of the string vector being negative.

5. The method of claim 4, further comprising:
skipping overlapping constraints in response to the vertical component of the string vector being negative; and
applying the overlapping constraints on the string vector in response to the vertical component of the string vector not being negative.

6. The method of claim 1, further comprising:
in response to a vertical component of the string vector being negative, determining that partial overlapping of the current string and the reference string is allowed;
reconstructing a first sample row of the current string; and
reconstructing a second sample row of the current string based on the first sample row of the current string.

7. The method of claim 1, further comprising:
accessing, in response to the reference string being overlapped with a sample row above the current CTU, a buffer storing samples in the sample row for a reconstruction of the current string.

8. An apparatus for video decoding, comprising:
processing circuitry configured to:
determine a string vector for a current string in a first sub-block of a current coding tree unit (CTU), the string vector pointing to a reference string for the current string, the reference string being positioned across a boundary such that a first portion of the reference string is in a second sub-block and a second portion of the reference string is in a third sub-block of the CTU;
determine whether a vertical cross boundary constraint or a horizontal cross boundary constraint are applied to the reference string;
in response to a determination that (i) the vertical cross boundary constraint is applied and (ii) the boundary of the second sub-block and the third sub-block is a vertical boundary, determine that the reference string is not allowed; and
in response to a determination that (i) the horizontal cross boundary constraint is applied and (ii) the boundary of the second sub-block and the third sub-block is a horizontal boundary, determine that the reference string is not allowed.

9. The apparatus of claim 8, wherein the processing circuitry is configured to:
reconstruct a first sample row of the current string before a reconstruction of a second sample row of the current string.

10. The apparatus of claim 9, wherein the processing circuitry is configured to:
reconstruct the second sample row of the current string based on the first sample row of the current string.

11. The apparatus of claim 8, wherein the processing circuitry is configured to:
determine that partial overlapping of the current string and the reference string is allowed in response to a vertical component of the string vector being negative.

12. The apparatus of claim 11, wherein the processing circuitry is configured to:
skip overlapping constraints in response to the vertical component of the string vector being negative; and
apply the overlapping constraints on the string vector in response to the vertical component of the string vector not being negative.

13. The apparatus of claim 8, wherein the processing circuitry is configured to:
in response to a vertical component of the string vector is negative, determine that partial overlapping of the current string and the reference string is allowed;
reconstruct a first sample row of the current string; and
reconstruct a second sample row of the current string based on the first sample row of the current string.

14. The apparatus of claim 8, wherein the processing circuitry is configured to:
access, in response to the reference string being overlapped with a sample row above the current CTU, a buffer storing samples in the sample row for a reconstruction of the current string.

15. A non-transitory computer-readable medium storing instructions which when executed by a computer for video decoding cause the computer to perform:
determining a string vector for a current string in a first sub-block of a current coding tree unit (CTU), the string vector pointing to a reference string for the current string, the reference string being positioned across a boundary such that a first portion of the reference string is in a second sub-block and a second portion of the reference string is in a third sub-block of the CTU;
determining whether a vertical cross boundary constraint or a horizontal cross boundary constraint are applied to the reference string is;
in response to a determination that (i) the vertical cross boundary constraint is applied and (ii) the boundary of the second sub-block and the third sub-block is a vertical boundary, determining that the reference string is not allowed; and
in response to a determination that (i) the horizontal cross boundary constraint is applied and (ii) the boundary of the second sub-block and the third sub-block is a horizontal boundary, determining that the reference string is not allowed.

16. The non-transitory computer-readable medium of claim 15, wherein the instructions cause the computer to perform:
reconstructing a first sample row of the current string before a reconstruction of a second sample row of the current string; and
reconstructing the second sample row of the current string based on the first sample row of the current string.

17. The non-transitory computer-readable medium of claim 15, wherein the instructions cause the computer to perform:
in response to a vertical component of the string vector being negative, determining that partial overlapping of the current string and the reference string is allowed;
reconstructing a first sample row of the current string; and
reconstructing a second sample row of the current string based on the first sample row of the current string.

\* \* \* \* \*